US008735969B1

(12) United States Patent
Lai et al.

(10) Patent No.: US 8,735,969 B1
(45) Date of Patent: May 27, 2014

(54) SEMICONDUCTOR STRUCTURE AND MANUFACTURING METHOD OF THE SAME

(71) Applicant: Macronix International Co., Ltd., Hsinchu (TW)

(72) Inventors: Erh-Kun Lai, Taichung (TW); Yen-Hao Shih, New Taipei (TW); Shih-Chang Tsai, Hsinchu County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/670,669

(22) Filed: Nov. 7, 2012

(51) Int. Cl.
*H01L 29/66* (2006.01)
(52) U.S. Cl.
USPC ........... 257/328; 257/314; 257/315; 257/316; 257/319; 257/329
(58) Field of Classification Search
USPC .............. 257/314, 315, 316, 319, 328, 329
See application file for complete search history.

(56) References Cited

U.S. PATENT DOCUMENTS

2012/0329224 A1* 12/2012 Kong et al. ............ 438/268

* cited by examiner

*Primary Examiner* — Tan N Tran
(74) *Attorney, Agent, or Firm* — McClure, Qualey & Rodack, LLP

(57) ABSTRACT

A semiconductor structure and a manufacturing method thereof are provided. The semiconductor structure includes a stacked structure, a plurality of first conductive blocks, a plurality of first conductive layers, a plurality of second conductive layers, and a plurality of conductive damascene structures. The stacked structure, comprising a plurality of conductive strips and a plurality of insulating strips, is formed on a substrate, and the conductive strips and the insulating strips are interlaced. The first conductive blocks are formed on the stacked structure. The first conductive layers and the second conductive layers are formed on two sidewalls of the stacked structure, respectively. The conductive damascene structures are formed on two sides of the stacked structure, wherein each of the first conductive blocks is electrically connected to each of the conductive damascene structures via each of the first conductive strips and each of the second conductive strips.

19 Claims, 39 Drawing Sheets

SEMICONDUCTOR STRUCTURE AND MANUFACTURING METHOD OF THE SAME

BACKGROUND OF THE INVENTION

1. Field of the Invention

The disclosure relates in general to a semiconductor structure and a manufacturing method of the same, and more particularly to a semiconductor structure and a manufacturing method of the same for a memory device.

2. Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for memory devices focuses on small sizes and large memory capacities. However, as the size of memory devices is reduced, the feature sizes of memory cells are decreased as well, causing a decrease in reliability of memory devices. As such, it is desirable to develop memory devices with improved reliability.

SUMMARY OF THE INVENTION

The invention is directed to a semiconductor structure and a manufacturing method of the same, which can be used in memory devices. In the semiconductor structure, each of conductive damascene structures is formed independently on two sides of a stacked structure by a damascene process, such that the conductive damascene structures are perfectly separated from one another, there would be no residual conductive materials between the conductive damascene structures, thus, a good insulation between the conductive damascene structures is achieved, and the reliability of memory devices can be improved.

According to one embodiment of the present disclosure, a semiconductor structure is provided. The semiconductor structure comprises a stacked structure, a plurality of first conductive blocks, a plurality of first conductive layers, a plurality of second conductive layers, and a plurality of conductive damascene structures. The stacked structure is formed on a substrate, wherein the stacked structure comprises a plurality of conductive strips and a plurality of insulating strips, and the conductive strips and the insulating strips are interlaced. The first conductive blocks are formed on the stacked structure. The first conductive layers and the second conductive layers are formed on two sidewalls of the stacked structure, respectively.

The conductive damascene structures are formed on two sides of the stacked structure, wherein each of the first conductive blocks is electrically connected to each of the conductive damascene structures via each of the first conductive strips and each of the second conductive strips.

According to one embodiment of the present disclosure, a method of manufacturing a semiconductor structure is provided. The method comprises the following steps. A stacked structure is formed on a substrate, wherein a plurality of conductive strips and a plurality of insulating strips are formed, and the conductive strips and the insulating strips are interlaced. A plurality of first conductive blocks is formed on the stacked structure. A plurality of first conductive layers and a plurality of second conductive layers are formed on two sidewalls of the stacked structure, respectively. A plurality of conductive damascene structures is formed on two sides of the stacked structure, wherein each of the first conductive blocks is electrically connected to each of the conductive damascene structures via each of the first conductive strips and each of the second conductive strips.

The disclosure will become apparent from the following detailed description of the preferred but non-limiting embodiments. The following description is made with reference to the accompanying drawings.

BRIEF DESCRIPTION OF THE DRAWINGS

FIGS. 2A-2I illustrate a process for manufacturing a semiconductor structure according to one embodiment of the present disclosure.

DETAILED DESCRIPTION OF THE INVENTION

In the embodiment of the present disclosure, a semiconductor structure and a manufacturing method of the same are provided. In the semiconductor structure, each of conductive damascene structures is formed independently on two sides of a stacked structure by a damascene process, such that the conductive damascene structures are perfectly separated from one another, there would be no residual conductive materials between the conductive damascene structures, thus, a good insulation between the conductive damascene structures is achieved, and the reliability of memory devices can be improved. However, the descriptions disclosed in the embodiments of the disclosure such as detailed structures, manufacturing procedures, operating procedures, and material selections are for illustration only, not for limiting the scope of protection of the disclosure.

Figures 1A, 1B:
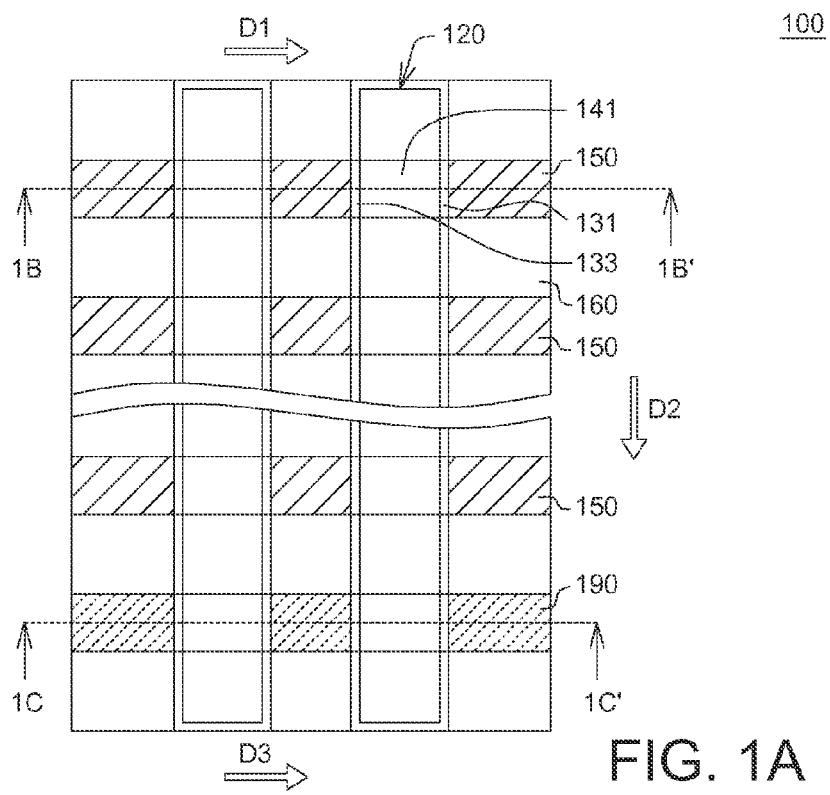
FIG. 1A shows a top view of a semiconductor structure according to an embodiment of the present disclosure.
FIG. 1B show a cross-sectional view along the section line 1B-1B' in FIG. 1A.
Figure 1C:
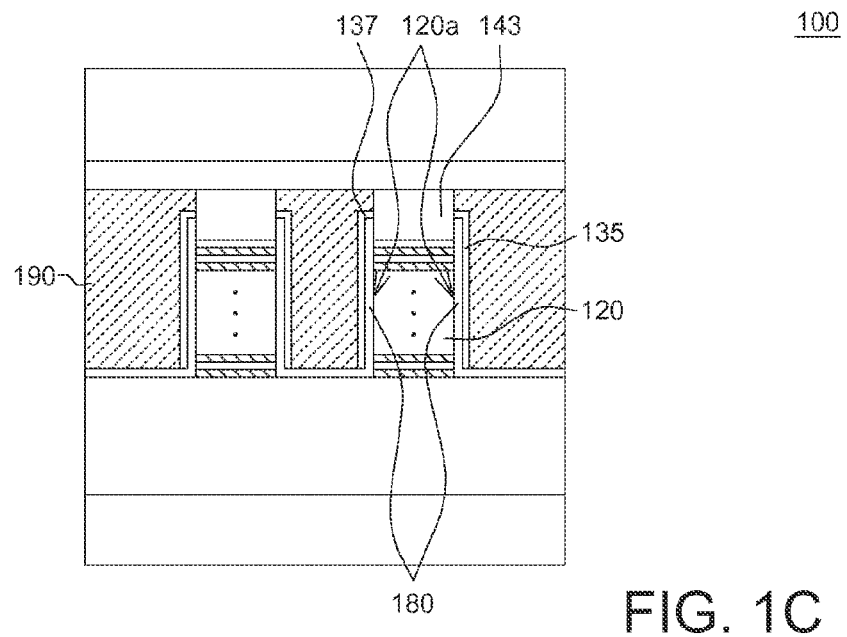
FIGS. 1C-1D show cross-sectional views along the section line 1C-1C' in FIG. 1A.
Figure 1D:
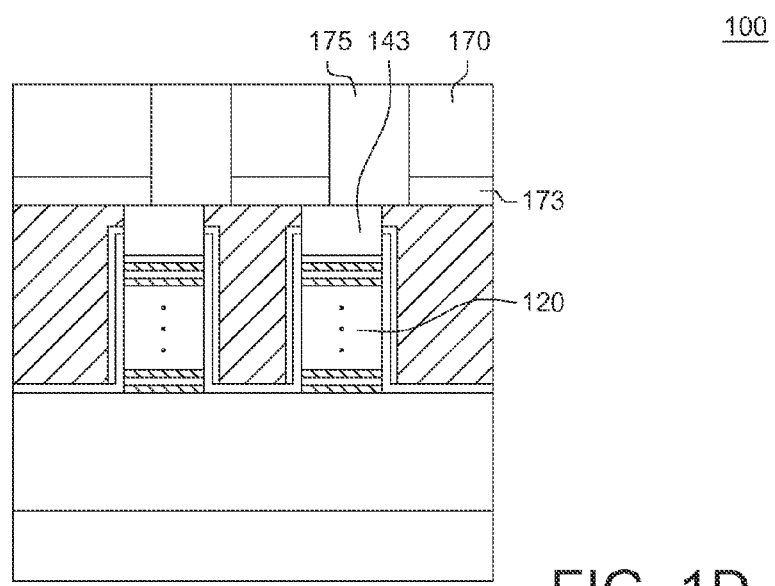

FIG. 1A shows a top view of a semiconductor structure according to an embodiment of the present disclosure. FIG. 1B show a cross-sectional view along the section line 1B-1B' in FIG. 1A. FIGS. 1C-1D show cross-sectional views along the section line 1C-1C' in FIG. 1A.

Please refer to FIGS. 1A-1B. Semiconductor structure 100 comprises a substrate 110, a stacked structure 120, a plurality of first conductive blocks 141, a plurality of first conductive layers 131, a plurality of second conductive layers 133, and a plurality of conductive damascene structures 150. The stacked structure 120 is formed on the substrate 110. The stacked structure 120 comprises a plurality of conductive strips 121 and a plurality of insulating strips 123, and the conductive strips 121 and the insulating strips 123 are interlaced. The first conductive blocks 141 are formed on the stacked structure 120, and the first conductive layers 131 and the second conductive layers 133 are formed on two sidewalls 120a of the stacked structure 120, respectively. The conductive damascene structures 150 are formed on two sides of the stacked structure 120, and each of the first conductive blocks 141 is electrically connected to each of the conductive damascene structures 150 via each of the first conductive strips 131 and each of the second conductive strips 133.

In an embodiment, as shown in FIG. 1A, the semiconductor structure 100 can further comprise an insulating structure 160 formed between the conductive damascene structures 150. In the embodiment, as shown in FIG. 1B, the semiconductor structure 100 can comprise a plurality of stacked structures 120, and the insulating structure 160 is also formed between the stacked structures 120. In the embodiment, the conductive damascene structures 150 are extended in a direction D1 perpendicular to a direction D2 which the stacked structure 120 is extended in. In the embodiment, the material of the insulating structure comprises, for example, nitrides.

In an embodiment, the semiconductor structure 100 is such as a 3D memory device, as shown in FIGS. 1A-1B, for example, the stacked structure 120 is a bit line, the conductive damascene structure 150 is the main body of a word line, and a working voltage is applied through the first conductive layer 131 and the second conductive layer 133. Conventionally, a full metal film is etched to form separated word lines. However, the word lines may be short-circuited due to the residual metal materials between the word lines, caused by an incomplete etching between the word lines, resulting in a malfunction of the memory device. In contrast, in the embodiment of the disclosure, each of conductive damascene structures 150 is formed independently on two sides of the stacked structure 120 by a damascene process, such that the conductive damascene structures 150 are perfectly separated from one another. As such, there would be no residual conductive materials between the conductive damascene structures (word lines), a good insulation between the word lines is achieved, the memory device can function well, and the reliability of memory device can be improved.

In an embodiment, as shown in FIG. 1B, the semiconductor structure 100 can further comprise a dielectric layer 170 formed on the stacked structure 120 and the conductive damascene structures 150. In the embodiment, the semiconductor structure 100 can further comprise an etching stop layer 173, and the etching stop layer 173 is such as disposed between the dielectric layer 170 and the stacked structure 120. In the embodiment, the material of the dielectric layer 170 such as comprises metal nitrides. However, the material selections are depending on the conditions applied and are not limited to the materials aforementioned.

In an embodiment, as shown in FIG. 1B, the semiconductor structure 100 can further comprise a memory materials layer 180 formed on the two sidewalls 120a of the stacked structure 120. In the embodiment, the memory material layer 180 is formed between the first conductive layers 131 and the stacked structure 120 and between the second conductive layers 133 and the stacked structure 120. In the embodiment, as shown in FIG. 1B, the memory material layer 180 is formed on the substrate 110. In another embodiment, the memory material layer 180 can also be only formed on the two sidewalls 120a of the stacked structure 120 and not formed on the substrate 110 (not shown). In the embodiment, the memory material layer 180 may have a multi-layer structure, for example, which may be ONO composite layers, ONONO composite layers, or BE-SONOS composite layers, or comprise, for example, an ONO structure formed by alternately stacking silicon oxide and silicon nitride.

In an embodiment, as shown in FIG. 1B, the semiconductor structure 100 can further comprise an oxide layer 115 formed between the stacked structure 120 and the substrate 110.

Please refer to FIG. 1C. The semiconductor structure 100 can further comprise a second conductive block 143, a third conductive layer 135, and a fourth conductive layer 137. The second conductive block 143 is formed on the stacked structure 120, and the third conductive layer 135 and the fourth conductive layer 137 are formed on the two sidewalls 120a of the stacked structure 120, respectively. The second conductive block 143 is electrically connected to the third conductive layer 135 and the fourth conductive layer 137. In the embodiment, as shown in FIG. 1A, the second conductive block 143, the third conductive layer 135, and the fourth conductive layer 137 are formed, for example, on an end of the semiconductor structure 100. In the embodiment, the material of the first conductive block 141 is, for example, the same as the material of the second conductive block 143 are the same, and the materials of the first conductive layer 131, the second conductive layer 133, the third conductive layer 135, and the fourth conductive layer 137 are, for example, the same. In the embodiment, the materials for the substrate 110, and conductive blocks 141 and 143, and the conductive layers 131, 133, 135, and 137 comprise, for example, silicon-containing materials, such as polysilicon. However, the material selections are depending on the conditions applied and are not limited to the materials aforementioned.

In an embodiment, the semiconductor structure 100 is such as a 3D memory device, as shown in FIG. 1D, the second conductive block 143 is such as a string select line (SSL).

In an embodiment, as shown in FIG. 1C, the semiconductor structure 100 can further comprise an insulating damascene structure 190 formed on two sides of the second conductive block 143, and the insulating damascene structure 190 is such as connected to the second conductive block 143. In the embodiment, as shown in FIG. 1C, the insulating damascene structure 190 covers, for example, the third conductive layer 135 and the fourth conductive layer 137. In the embodiment, the insulating damascene structure 190 is extended in a direction D3 parallel to the direction D1 which the conductive damascene structures 150 are extended in.

In an embodiment, referring to FIG. 1D, the semiconductor structure 100 can further comprise a contact hole 175 formed in the dielectric layer 170 and electrically connected to the second conductive block 143. In the embodiment, as shown in FIG. 1D, the contact hole 175 penetrates through the etching stop layer 173 to be electrically connected to the second conductive block 143.

The embodiments disclosed below are for elaborating a manufacturing method of the semiconductor structures of the disclosure. However, the descriptions disclosed in the embodiments of the disclosure such as detailed manufacturing procedures are for illustration only, not for limiting the scope of protection of the disclosure. Referring to FIGS. 2A-21, FIGS. 2A-21 illustrate a process for manufacturing a semiconductor structure according to one embodiment of the present disclosure.

Figure 2A:
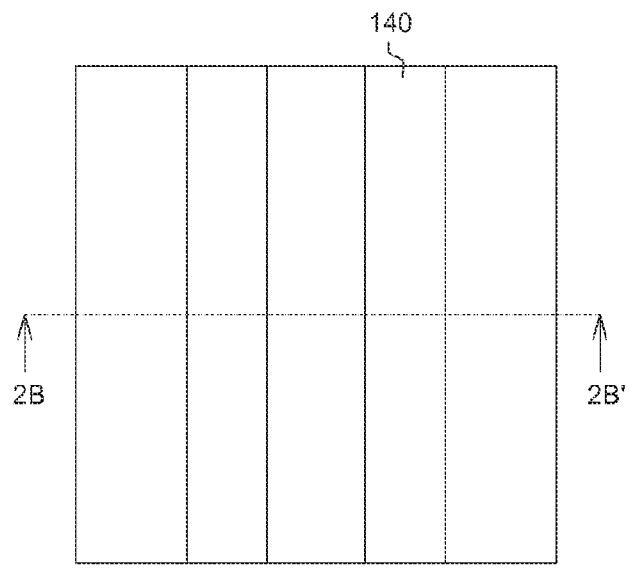
Figure 2B:
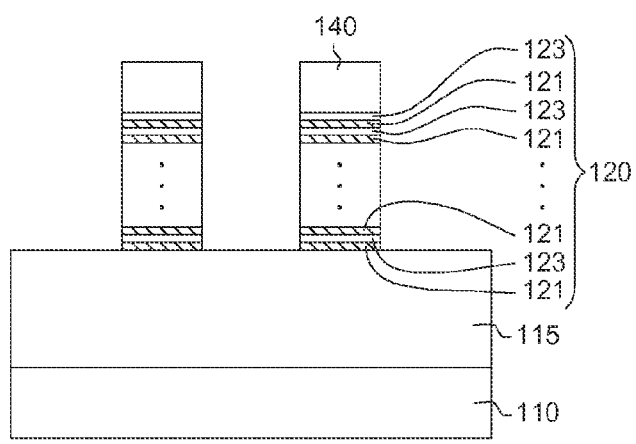

Referring to FIGS. 2A-2B (FIG. 2B shows a cross-sectional view along the section line 2B-2B' in FIG. 2A), a stacked structure 120 is formed on the substrate 110. The manufacturing method of forming the stacked structure 120 comprises, for example: forming a plurality of conductive strips 121 and a plurality of insulating strips 123, and the conductive strips 121 and the insulating strips 123 are interlaced. In an embodiment, a plurality of stacked structures 120 can also be formed on the substrate 110.

Next, as shown in FIGS. 2A-11E, a plurality of first conductive blocks 143 are formed on the stacked structure 120, and a plurality of first conductive layers 131 and a plurality of second conductive layers 131 are formed on two sidewalls 120a of the stacked structure 120, respectively. The manufacturing method of forming the first conductive blocks 143, the first conductive layers 131, and the second conductive layers 133 comprises, for example, the following steps.

As shown in FIGS. 2A-2B, a conductive material layer 140 is formed on the stacked structure 120. In the embodiment, an oxide layer 150 can also be formed between the stacked structure 120 and the substrate 110.

Figure 3A:
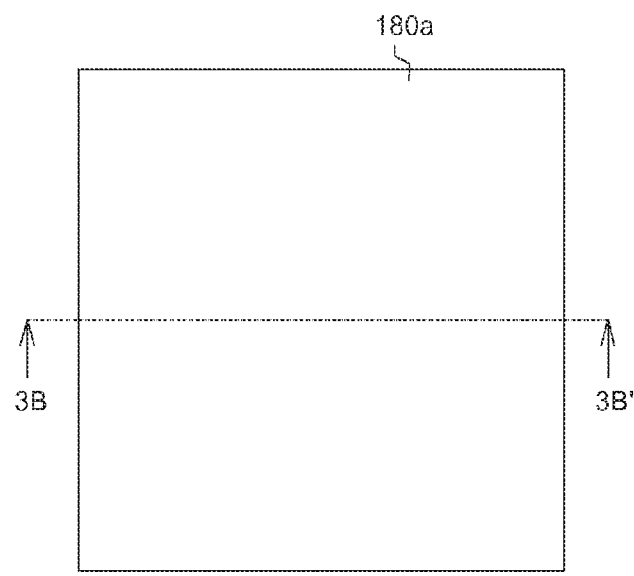
Figure 3B:
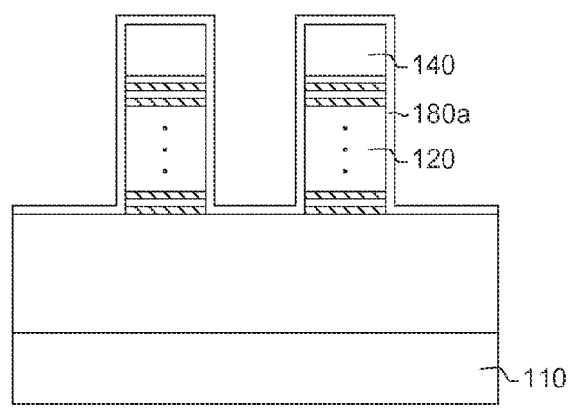

As shown in FIGS. 3A-3B (FIG. 3B shows a cross-sectional view along the section line 3B-3B' in FIG. 3A), a memory material coating layer 180a is formed on the stacked structure 120. In the embodiment, the memory material coating layer 180a fully covers the stacked structure 120, the conductive material layer 140, and the substrate 110. The memory material coating layer 180*a* comprises a charge trapping material, for example, ONO composite layers, ONONO composite layers, or BE-SONOS composite layers, or comprises, for example, an ONO structure formed by alternately stacking silicon oxide and silicon nitride.

Figure 4A:
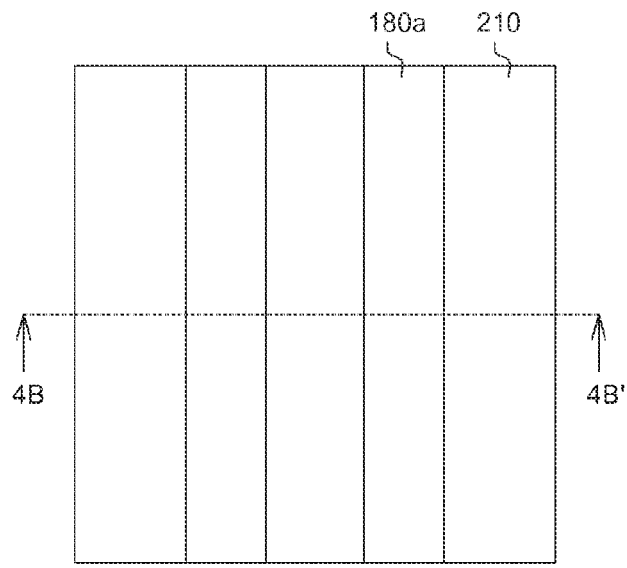
Figure 4B:
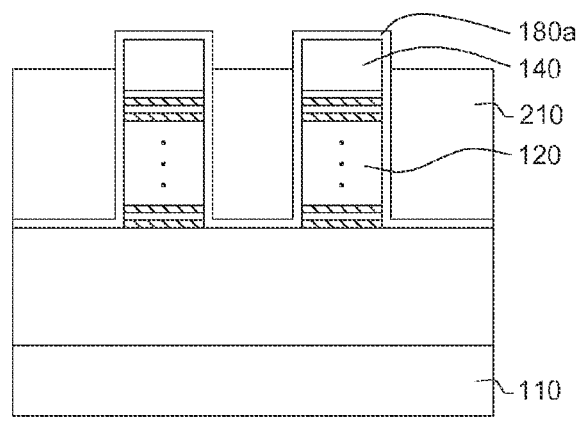

As shown in FIGS. 4A-4B (FIG. 4B shows a cross-sectional view along the section line 4B-4B' in FIG. 4A), a sacrificial layer 210 is formed on the substrate 110. In the embodiment, the sacrificial layer 210 surrounds the stacked structure 120 and the peripheral of the memory material coating layer 180*a*, and at least part of the conductive material layer 140 and the memory material coating layer 180*a* is exposed. In the embodiment, the sacrificial layer 210 comprises, for example, at least one of pure carbon, carbon-containing oxide, bottom antireflective coating (BARC), and silicon rich bulk (SHB). The sacrificial layer 210 may also be disposable films formed of carbon like organic materials, which are easily coated and removed. The sacrificial layer 210 may be formed by one etch back process which is highly selective to the memory material coating layer 180*a* for the memory material coating layer 180*a* to be exposed.

Figure 5A:
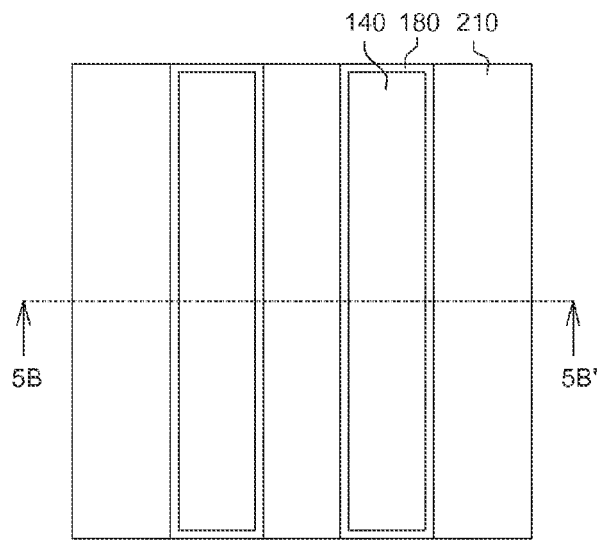
Figure 5B:
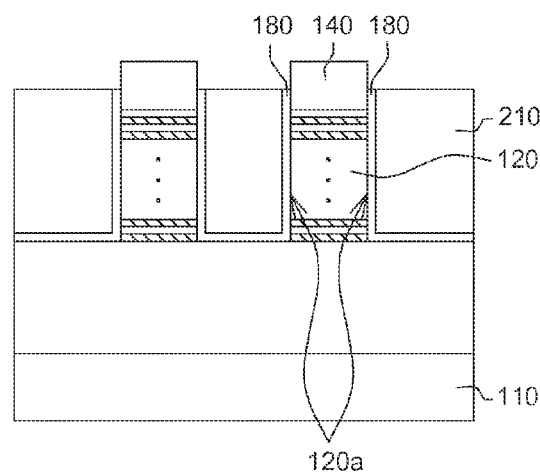

As shown in FIGS. 5A-5B (FIG. 5B shows a cross-sectional view along the section line 5B-5B' in FIG. 5A), the memory material coating layer 180*a* is etched to expose the conductive material layer 140 and form a memory material layer 180 on the two sidewalls 120*a* of the stacked structure 120. In the embodiment, the memory material coating layer 180*a* exposed from the sacrificial layer 210 is etched to form the memory material layer 180, and the top of the memory material layer 180 is substantially aligned with the upper surface of the sacrificial layer 210. In the embodiment, the memory material layer 180 is such as formed between the sacrificial layer 210 and the stacked structure 120.

Figure 6A:
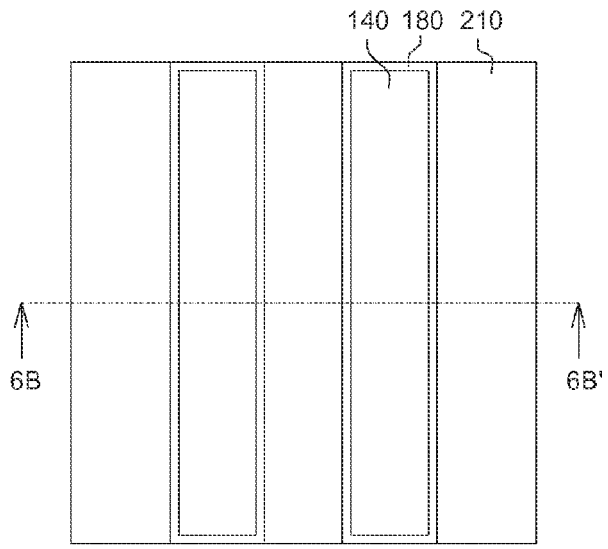
Figure 6B:
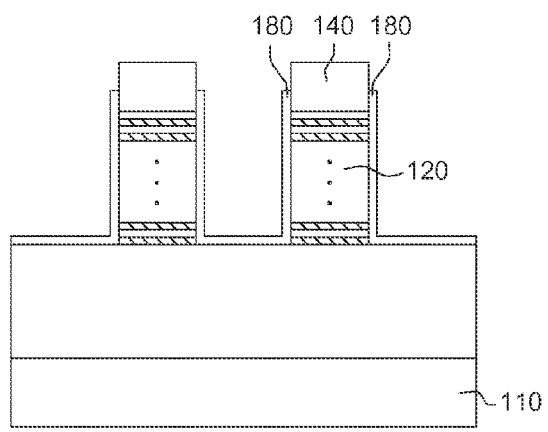

As shown in FIGS. 6A-6B (FIG. 6B shows a cross-sectional view along the section line 6B-6B' in FIG. 6A), the sacrificial layer 210 is removed to expose the memory material layer 180. In the embodiment, part of the memory material layer 180 on the substrate 110 can also be removed, such that the memory material layer 180 is only located on the two sidewalls 120*a* of the stacked structure 120.

Figure 7A:
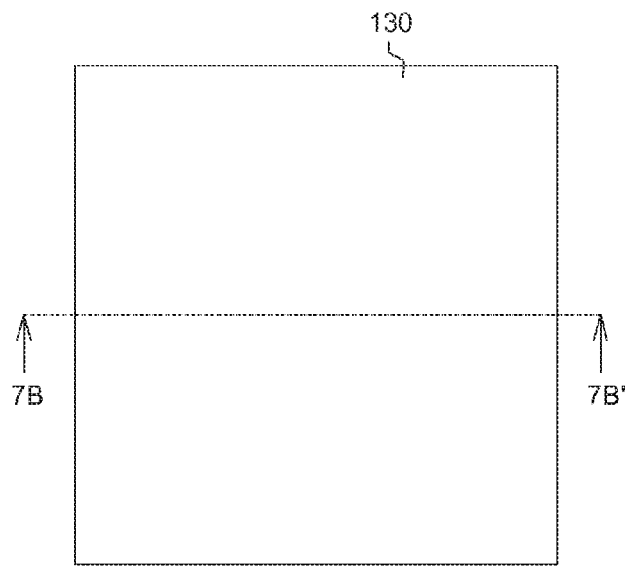
Figure 7B:
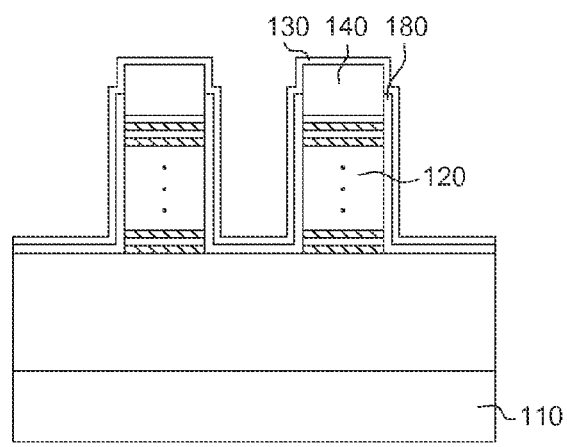

As shown in FIGS. 7A-7B (FIG. 7B shows a cross-sectional view along the section line 7B-7B' in FIG. 7A), a conductive material layer 130 is formed on the stacked structure 120 and the conductive material layer 140. In the embodiment, the conductive material layer 130 fully covers the conductive material layer 140 and the memory material layer 180. The memory material layer 180 may be highly doped polysilicon or a conformal conductive film.

Figure 8A:
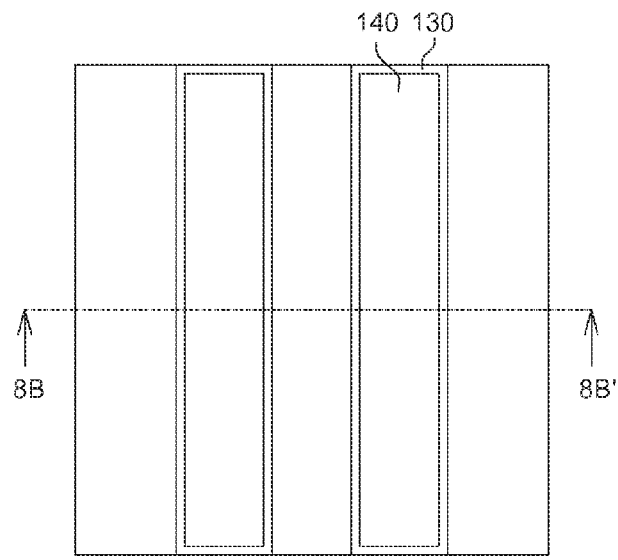
Figure 8B:
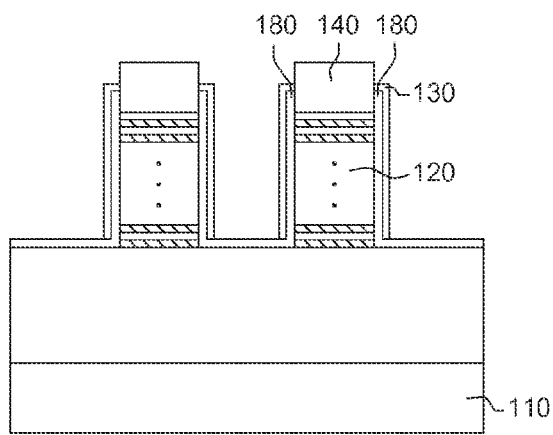

As shown in FIGS. 8A-8B (FIG. 8B shows a cross-sectional view along the section line 8B-8B' in FIG. 8A), the conductive material layer 130 is etched to expose part of the conductive material layer 140. In the embodiment, the conductive material layer 130 covers the memory material layer 180 and surrounds the stacked structure 120.

Figure 9A:
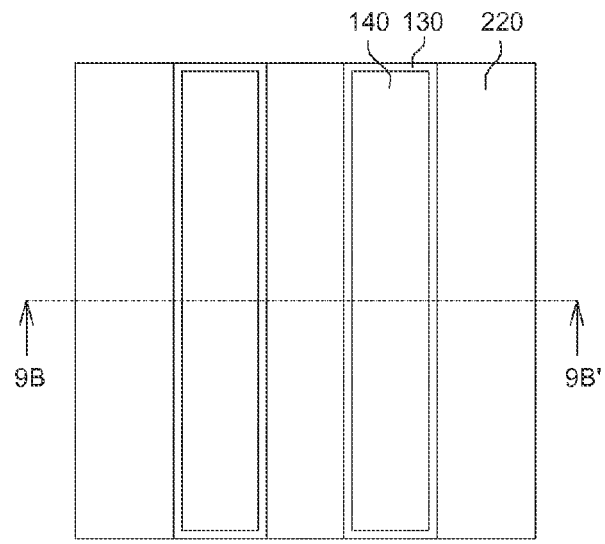
Figure 9B:
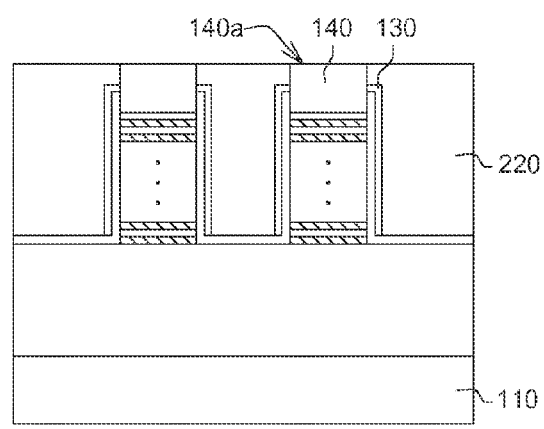
Figure 10A:
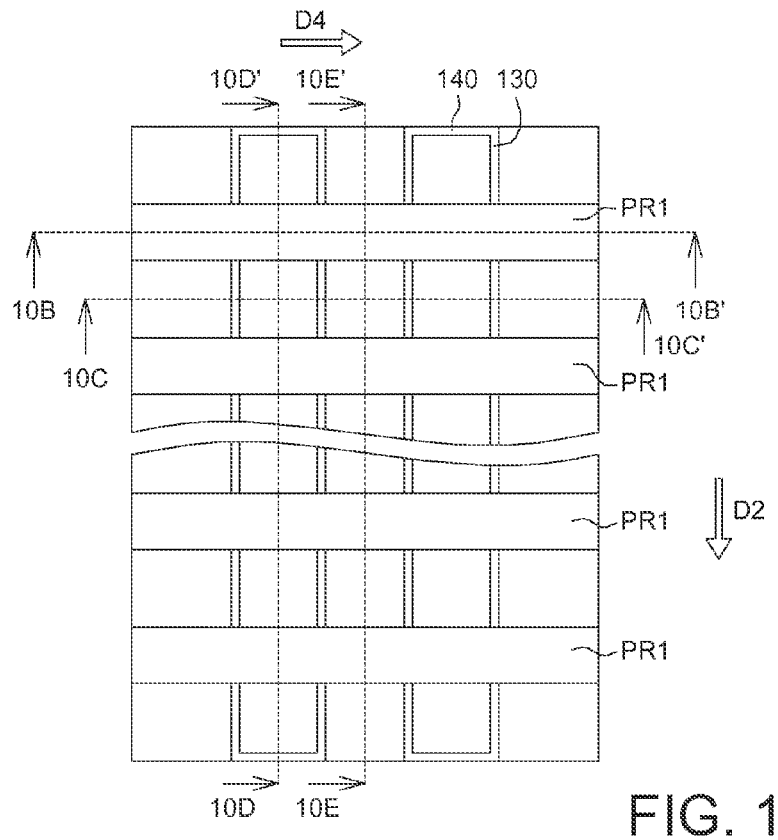
Figure 10B:
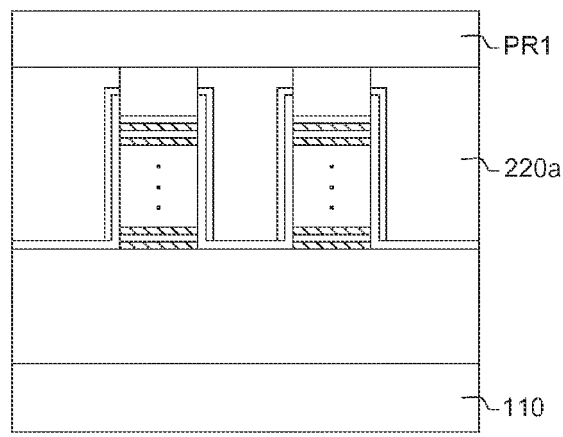
Figure 10C:
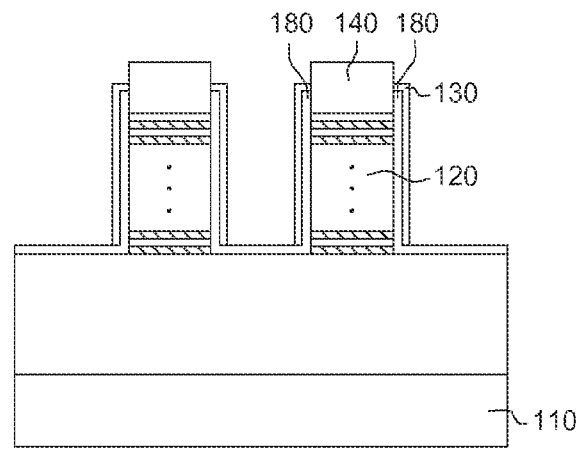
Figure 10D:
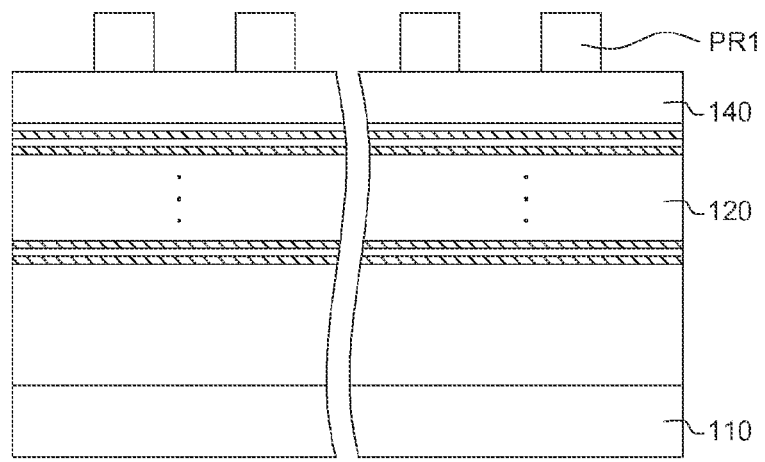
Figure 10E:
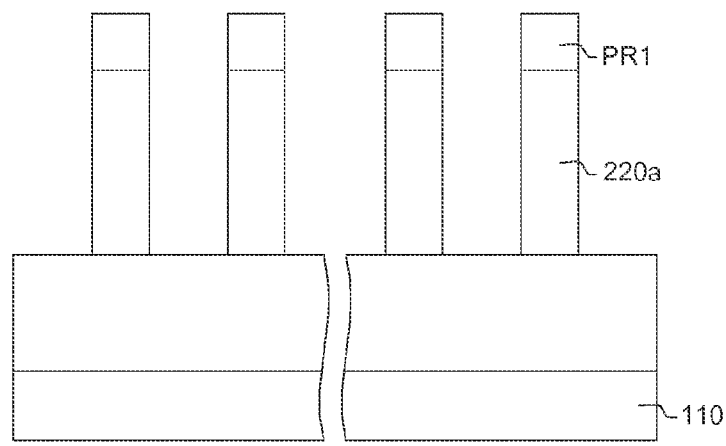
Figure 11A:
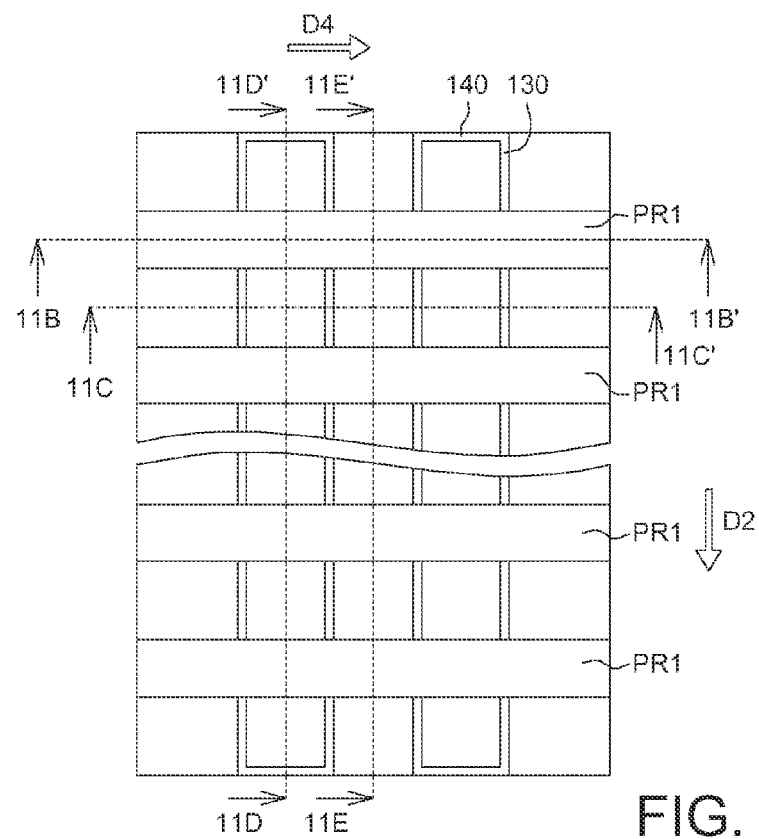
Figure 11B:
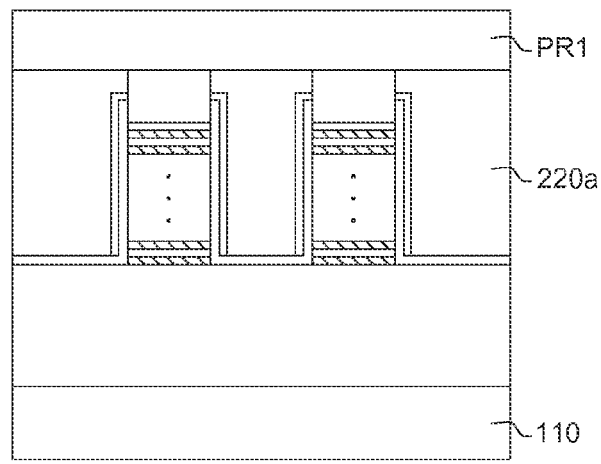
Figure 11C:
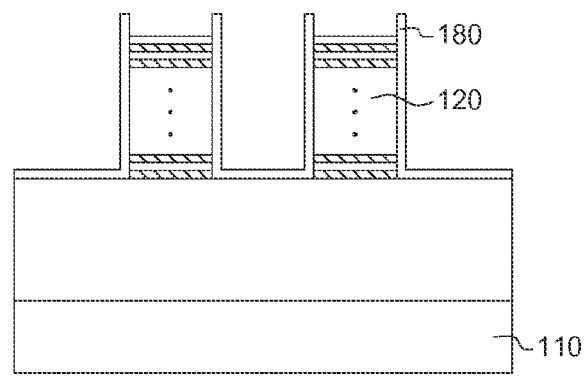
Figure 11D:
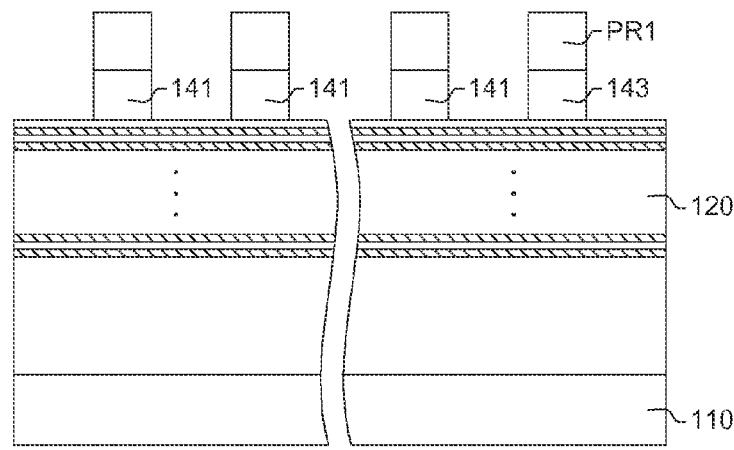
Figure 11E:
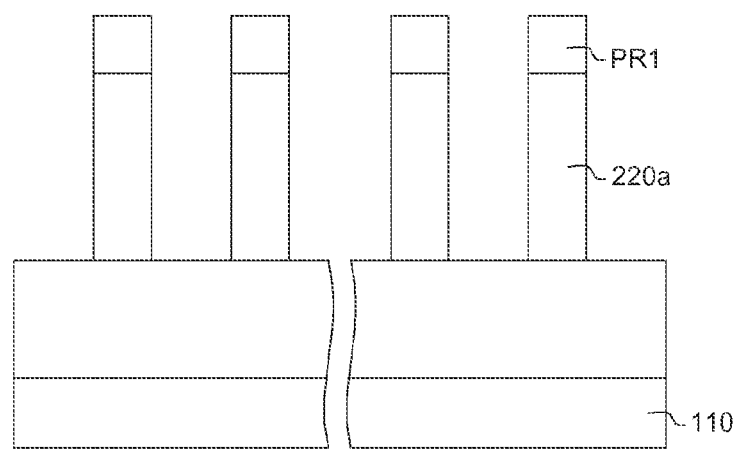
Figure 12A:
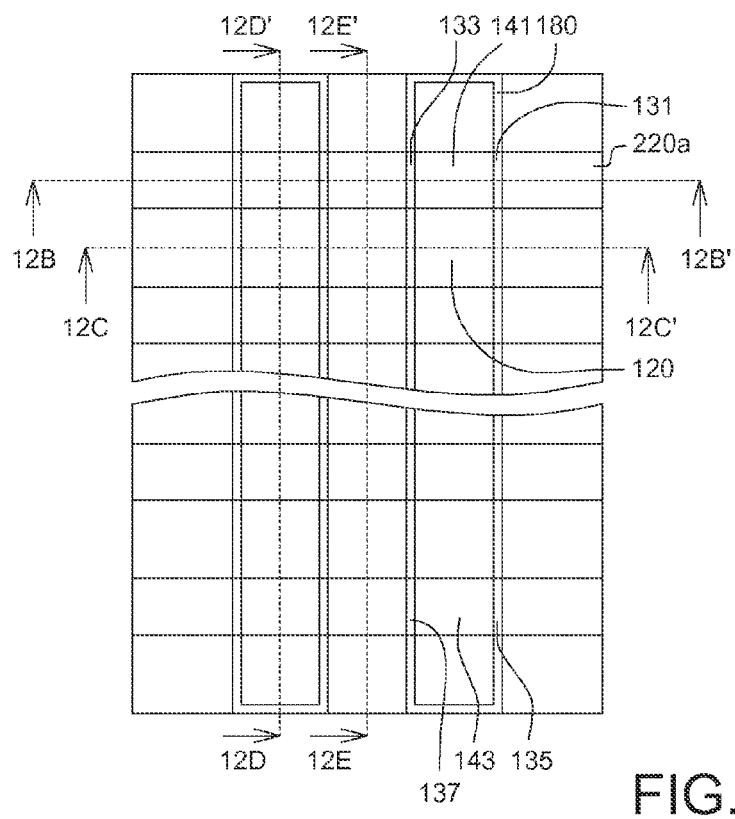
Figure 12B:
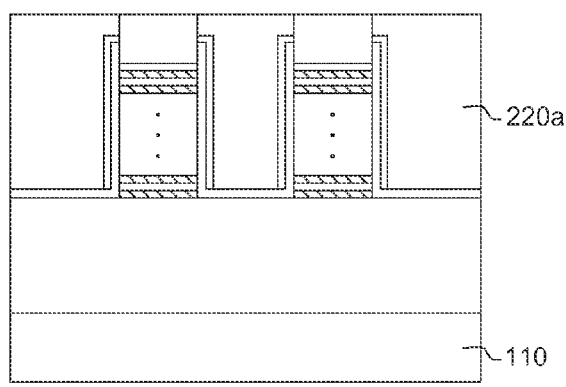
Figure 12C:
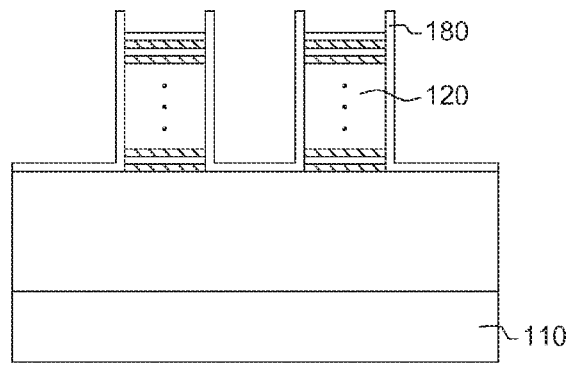
Figure 12D:
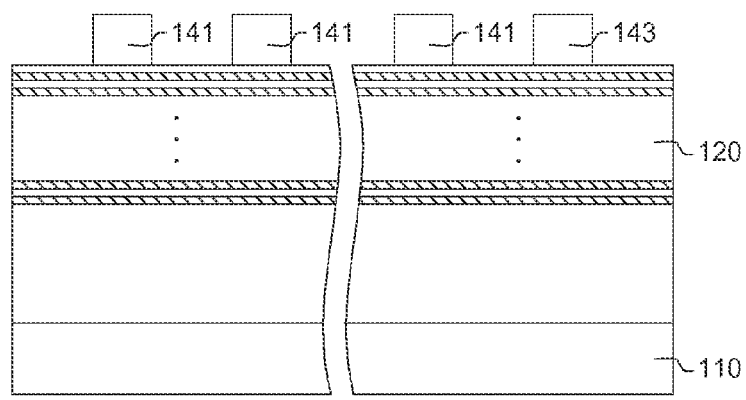
Figure 12E:
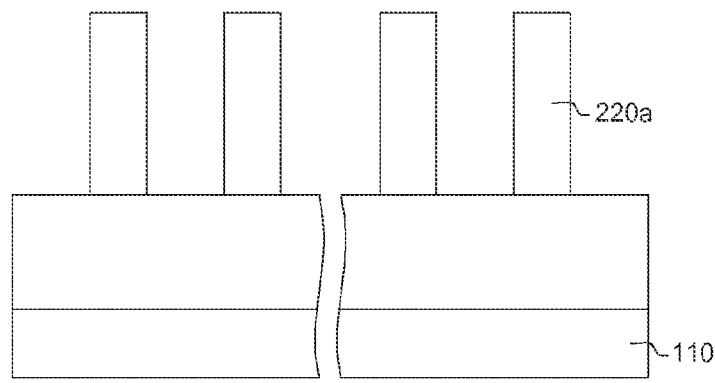
Figure 13A:
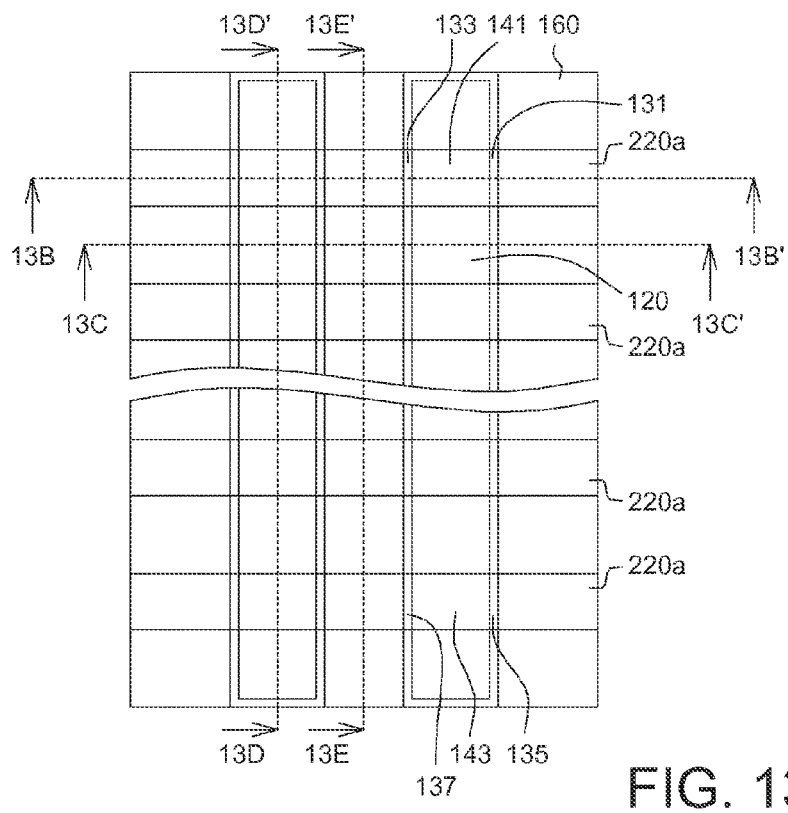
Figure 13B:
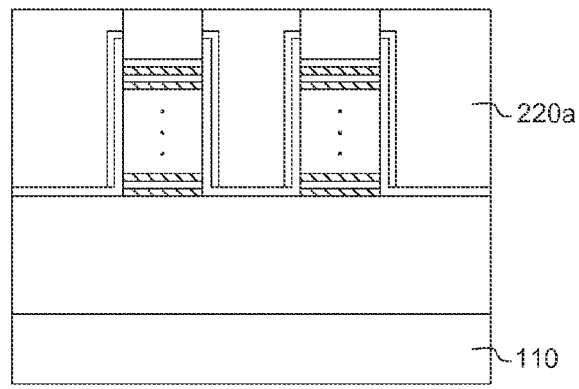
Figure 13C:
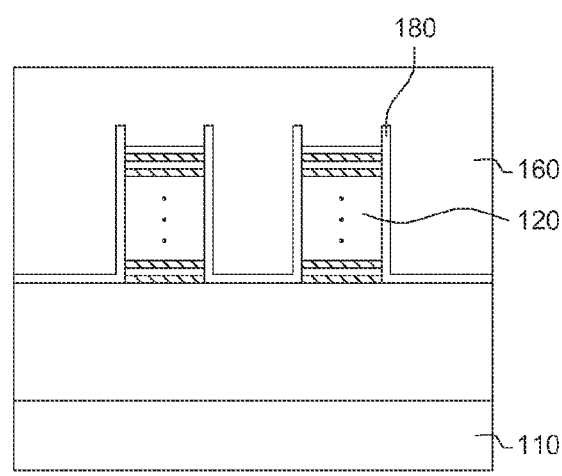
Figure 13D:
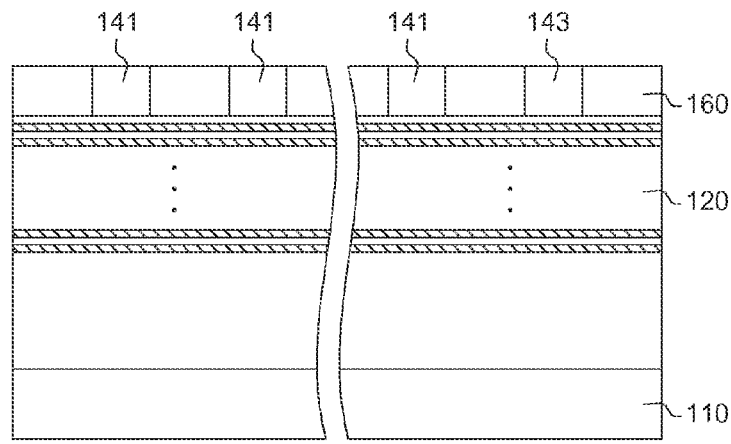
Figure 13E:
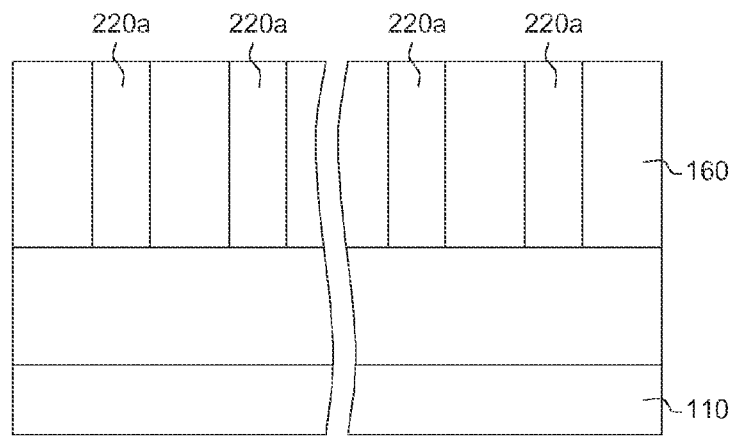
Figure 14A:
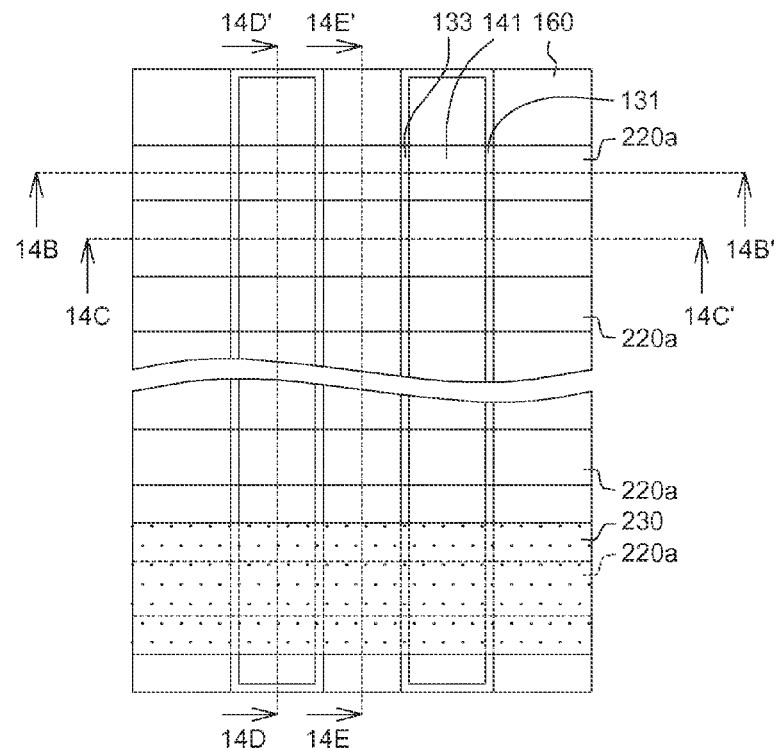
Figure 14B:
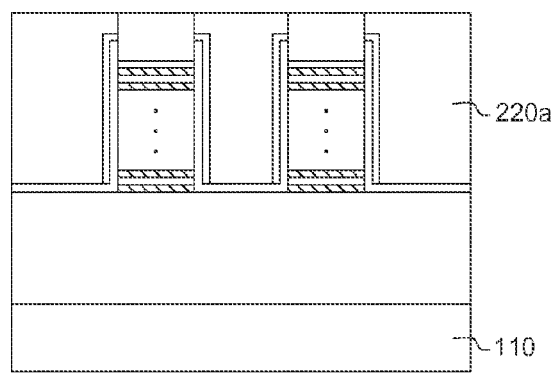
Figure 14C:
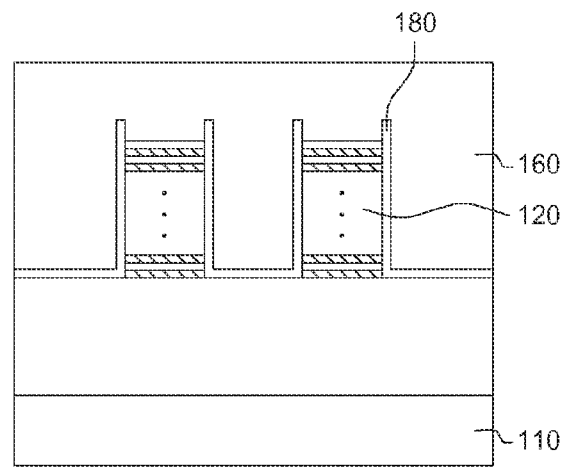
Figure 14D:
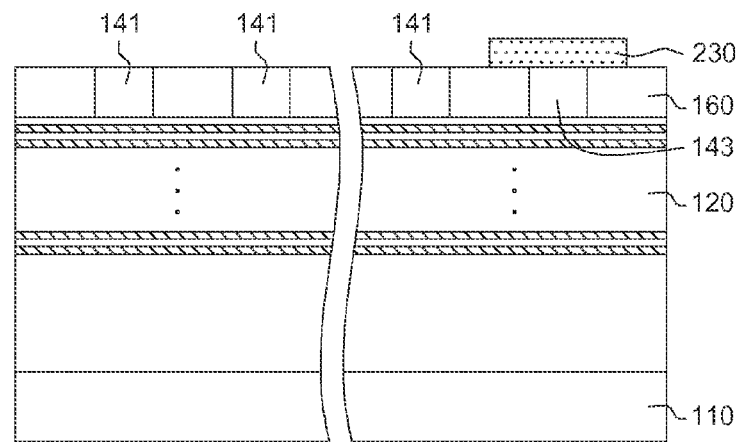
Figure 14E:
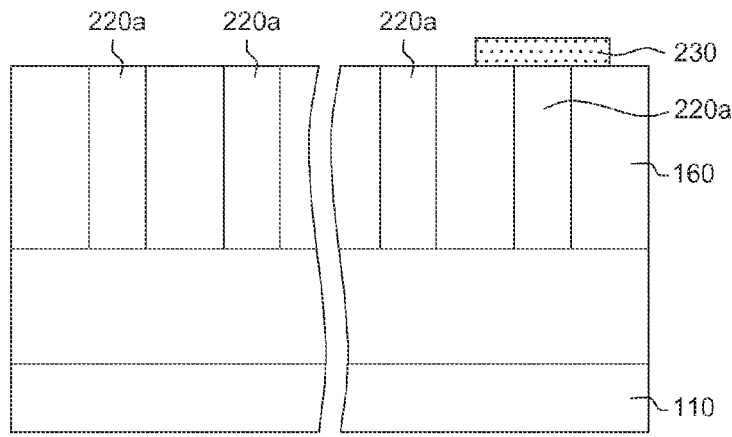
Figure 15A:
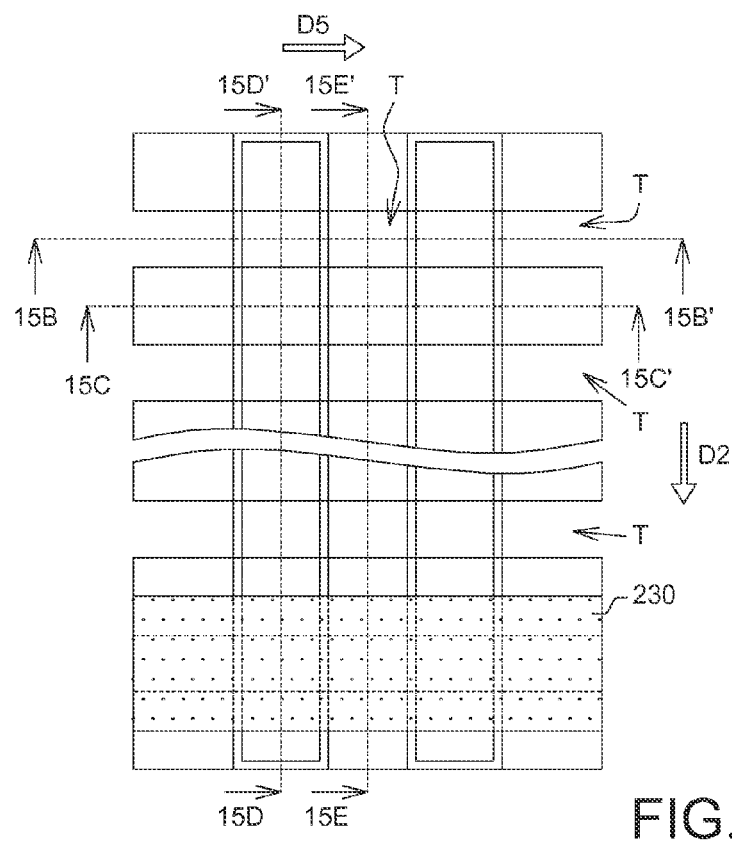
Figure 15B:
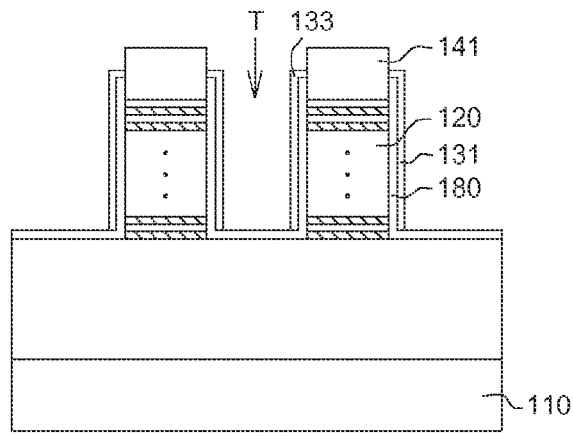
Figure 15C:
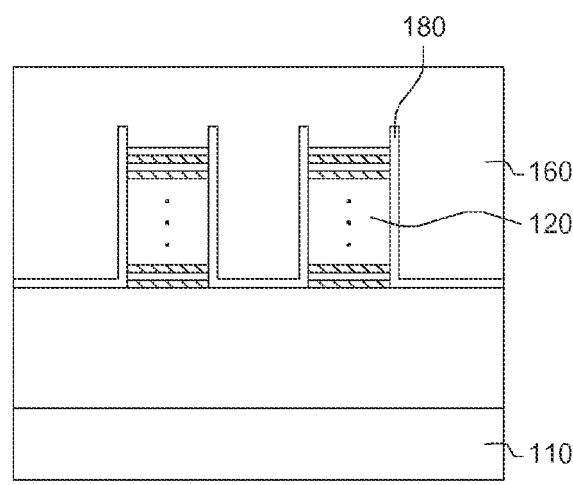
Figure 15D:
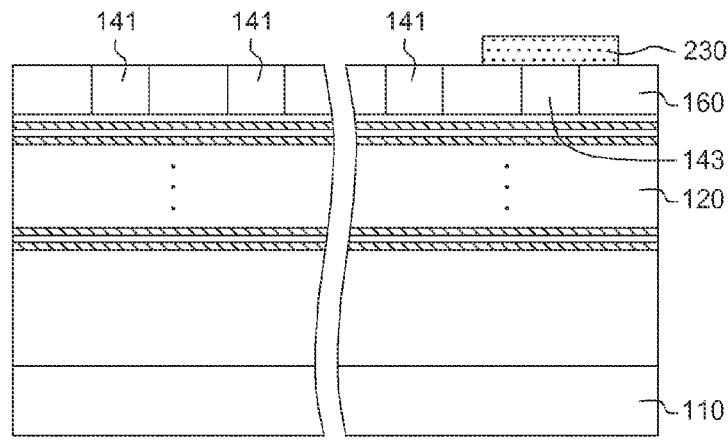
Figure 15E:
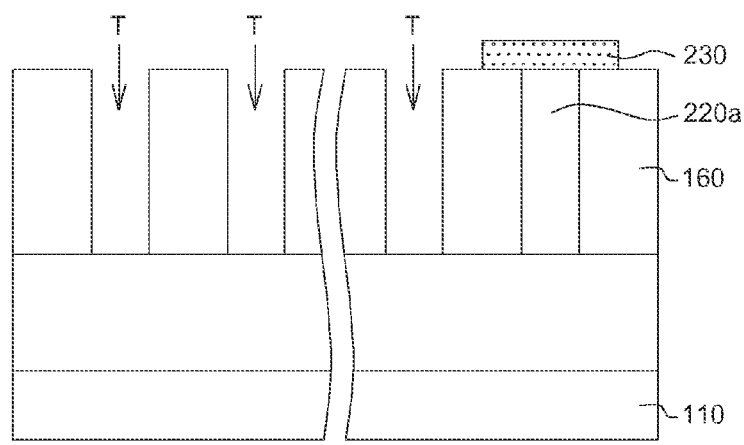
Figure 16A:
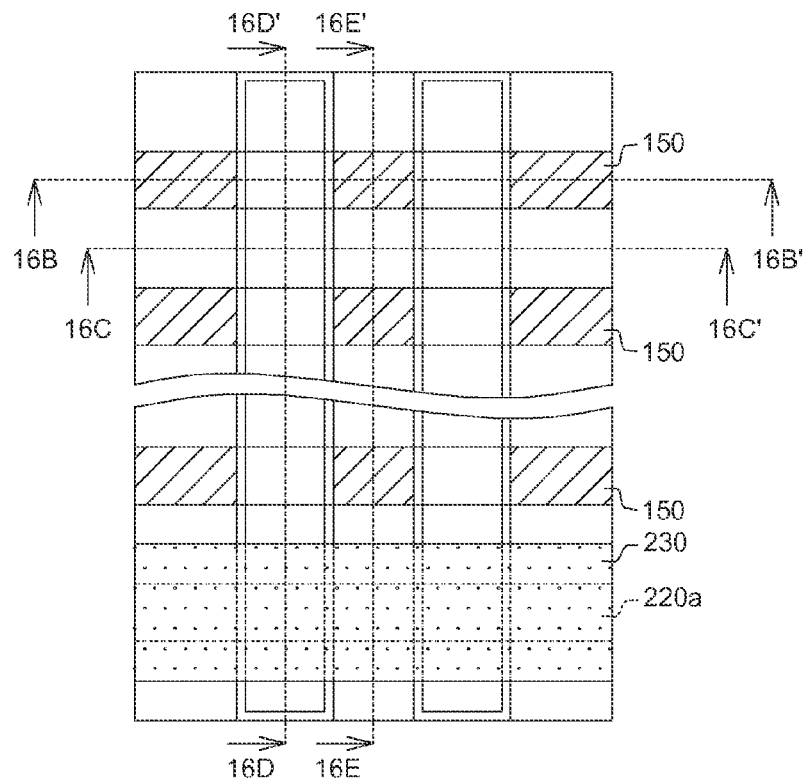
Figure 16B:
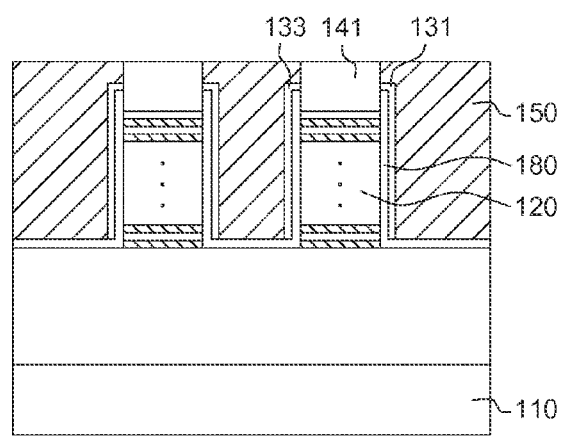
Figure 16C:
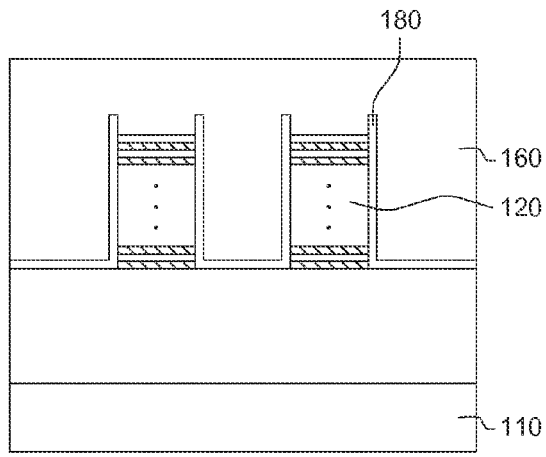
Figure 16D:
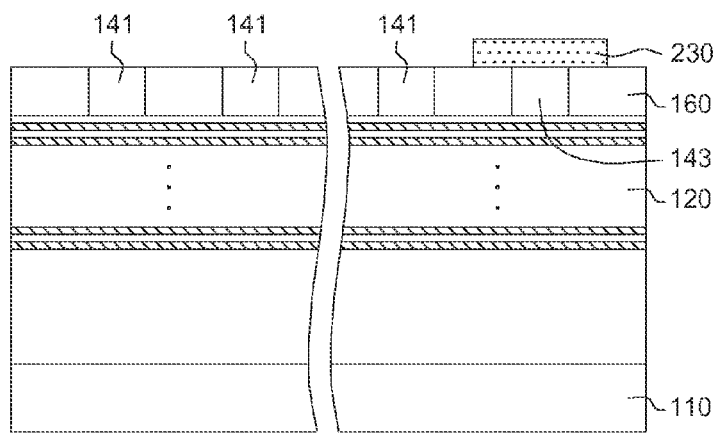
Figure 16E:
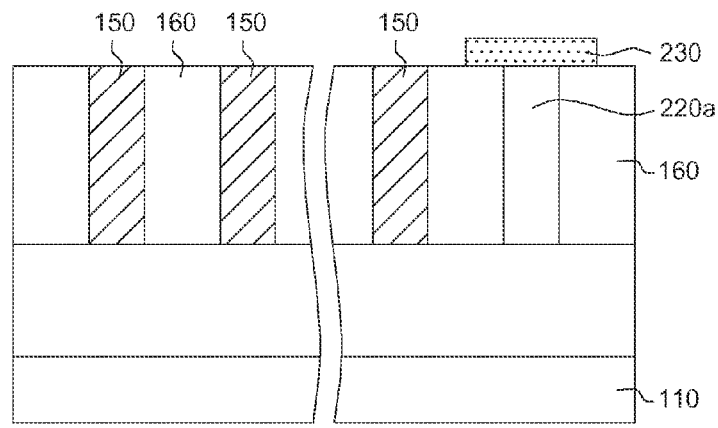
Figure 17A:
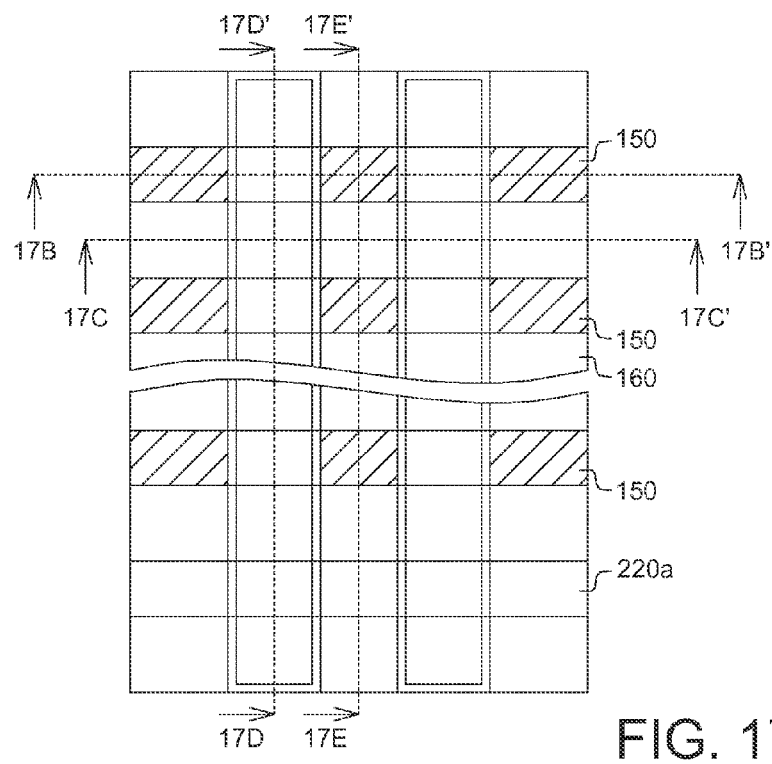
Figure 17B:
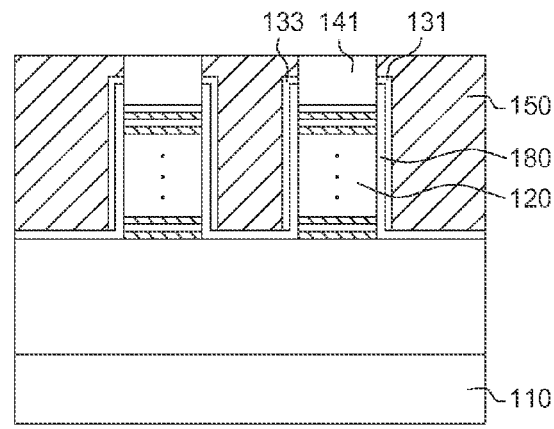
Figure 17C:
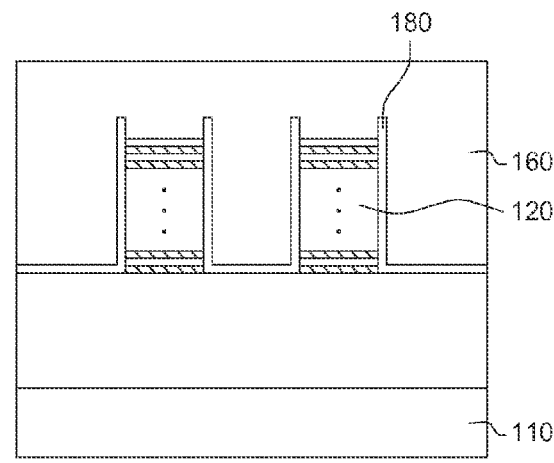
Figure 17D:
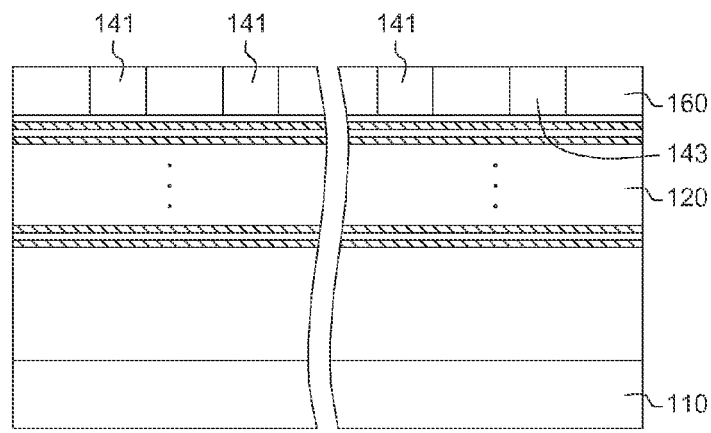
Figure 17E:
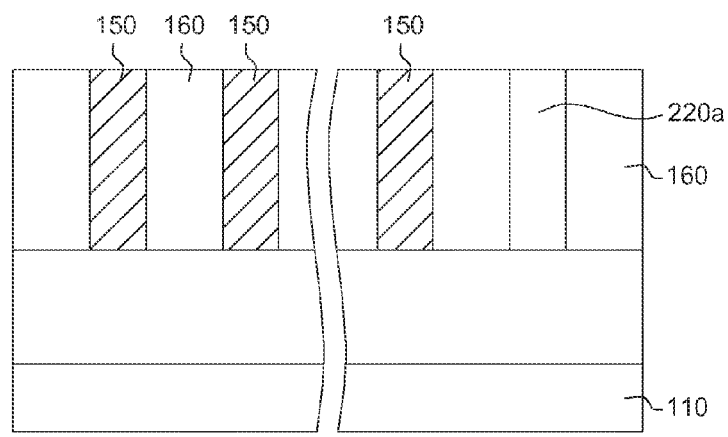
Figure 18A:
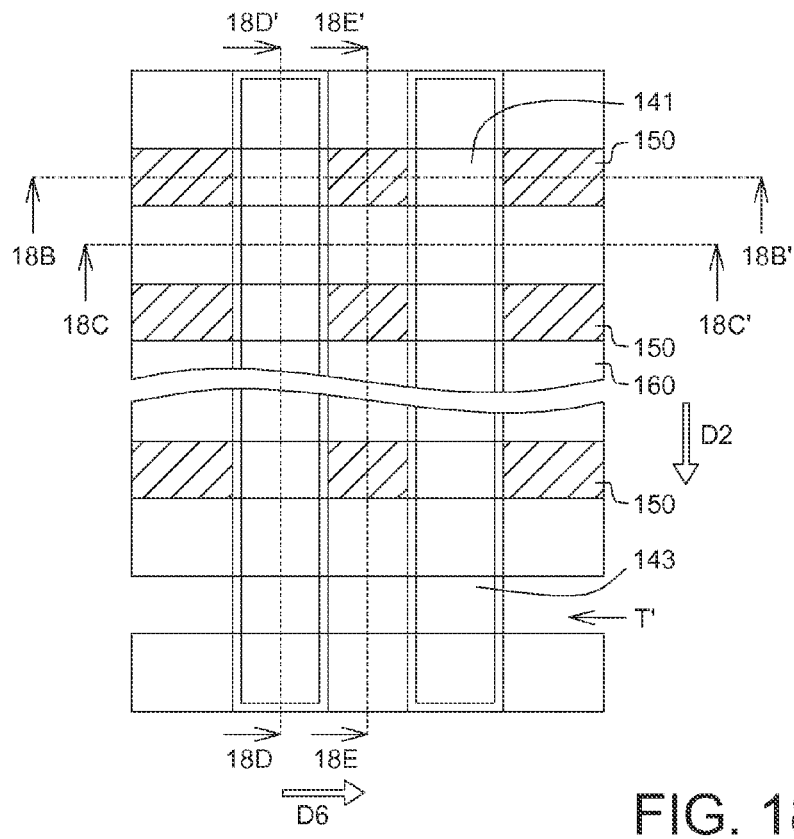
Figure 18B:
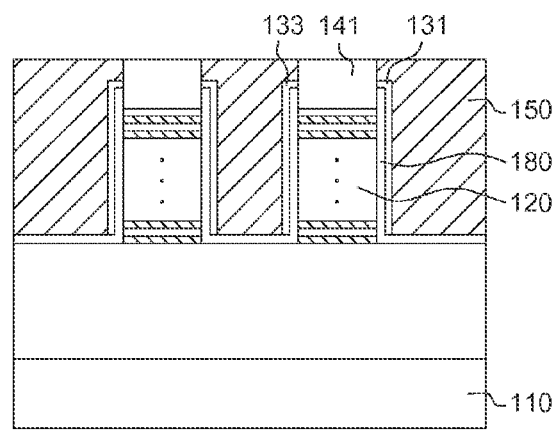
Figure 18C:
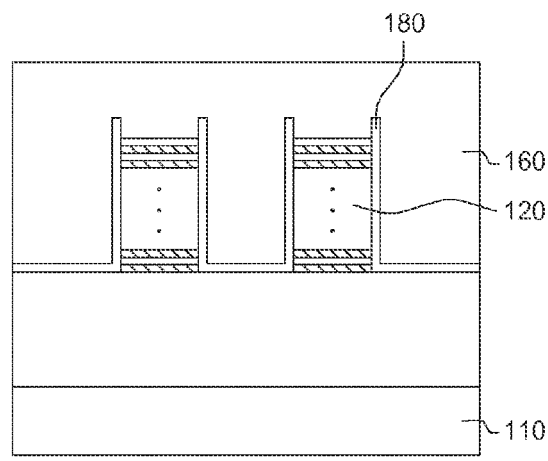
Figure 18D:
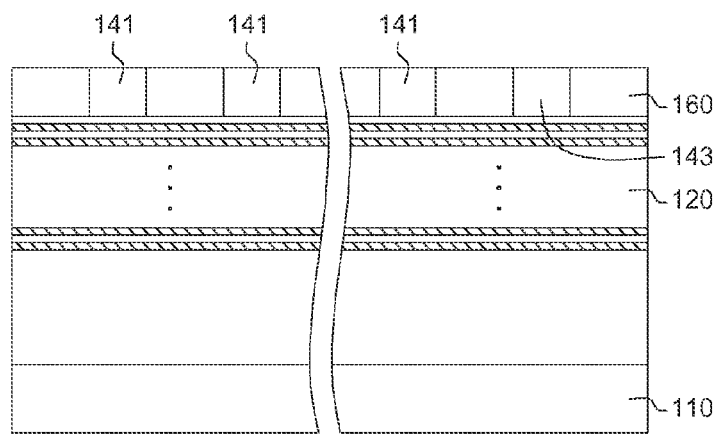
Figure 18E:
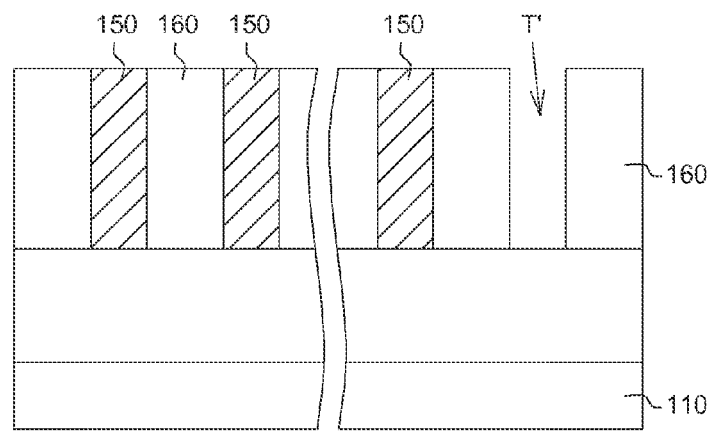
Figure 19A:
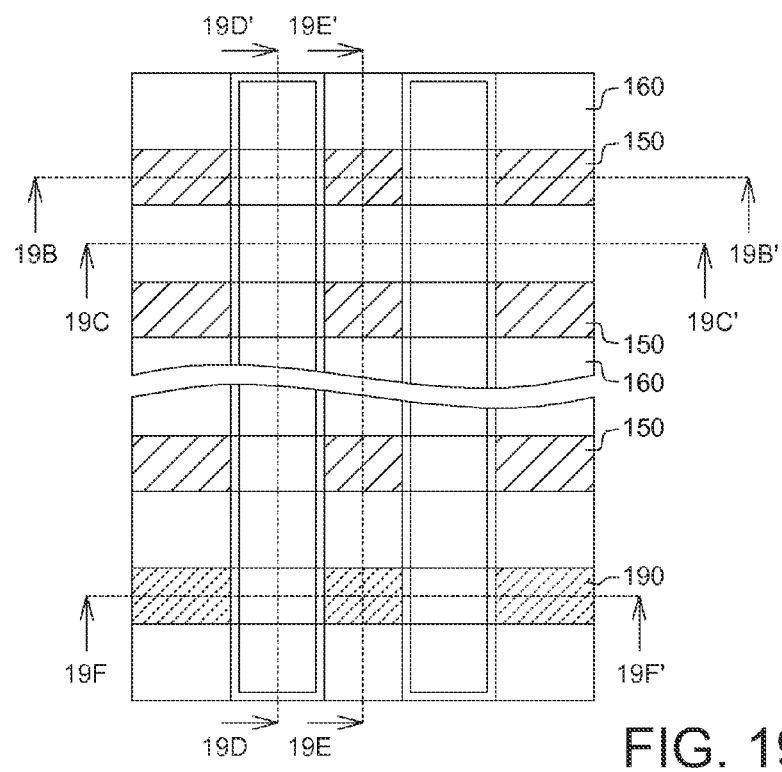
Figure 19B:
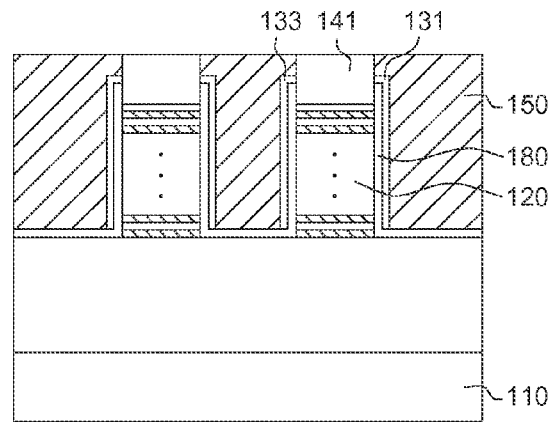
Figure 19C:
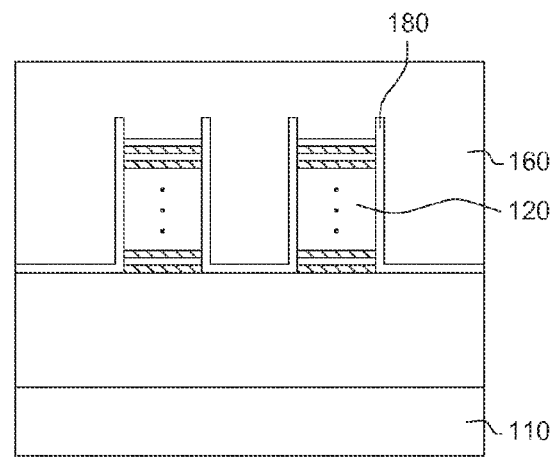
Figure 19D:
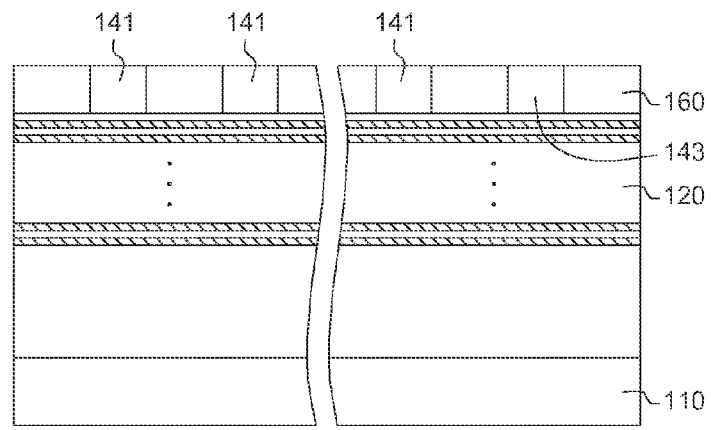
Figure 19E:
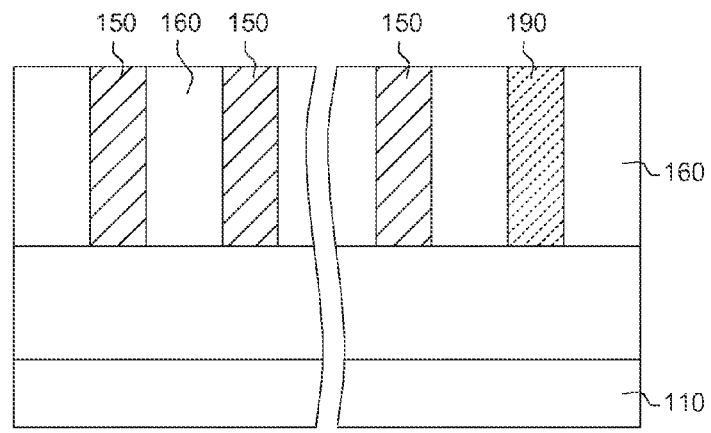
Figure 19F:
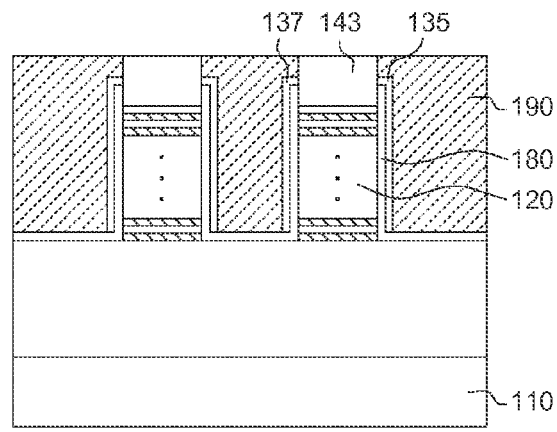
Figure 20A:
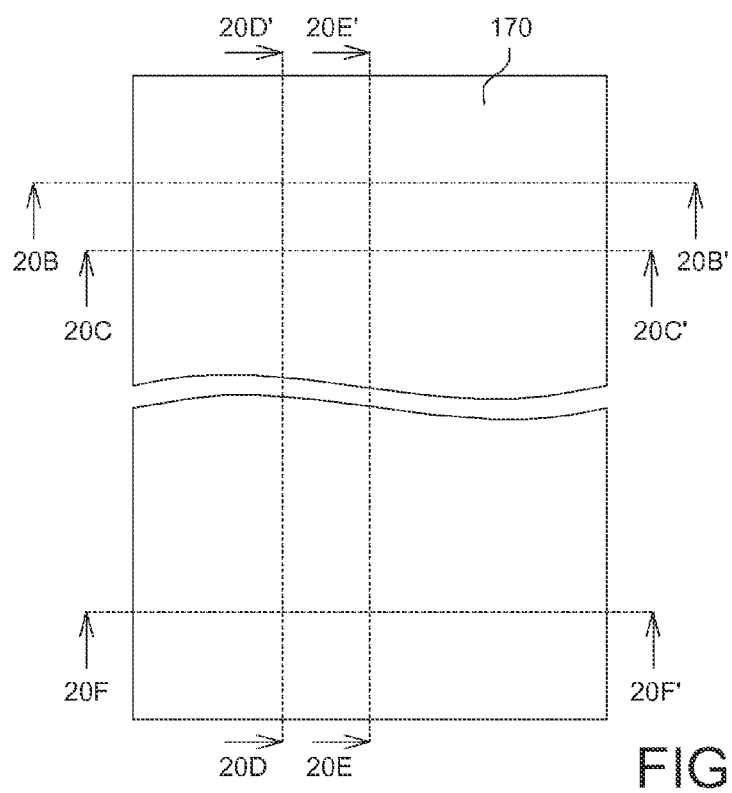
Figure 20B:
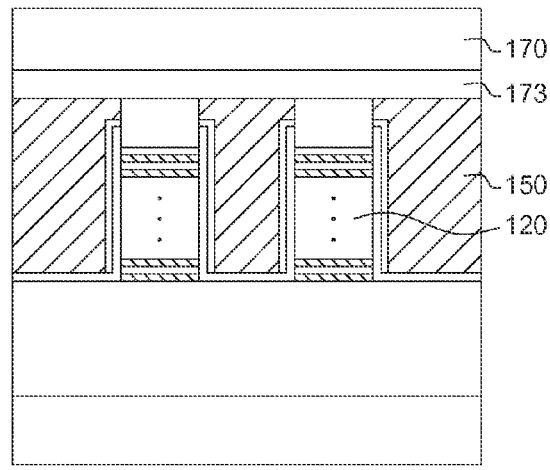
Figure 20C:
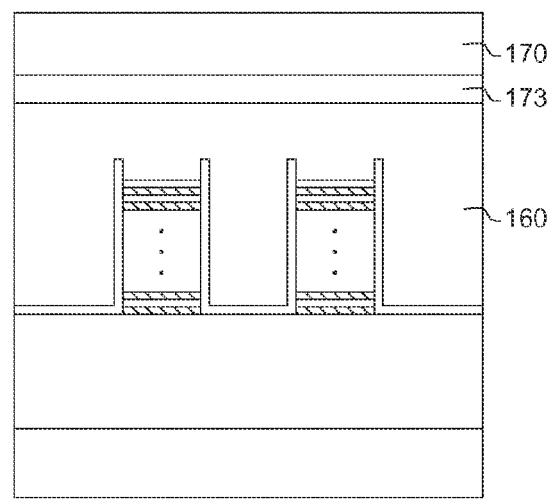
Figure 20D:
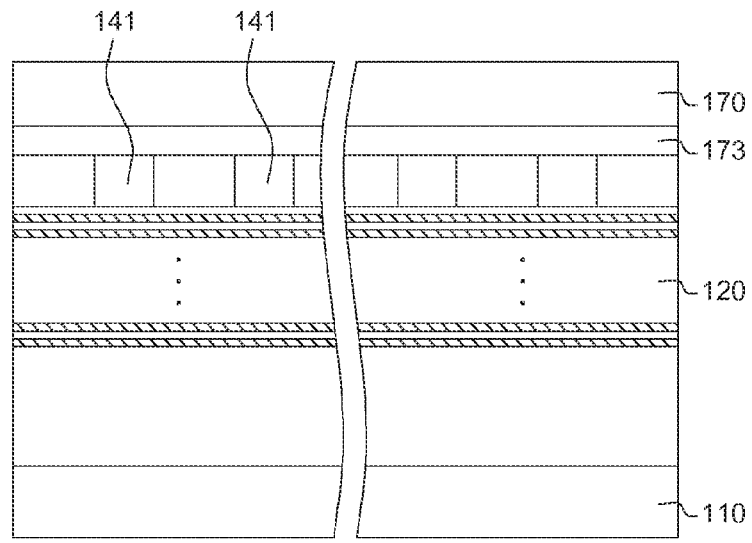
Figure 20E:
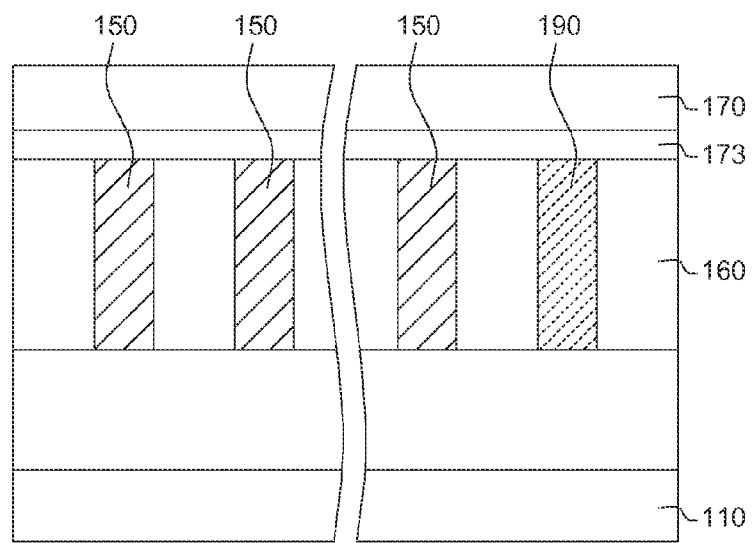
Figure 20F:
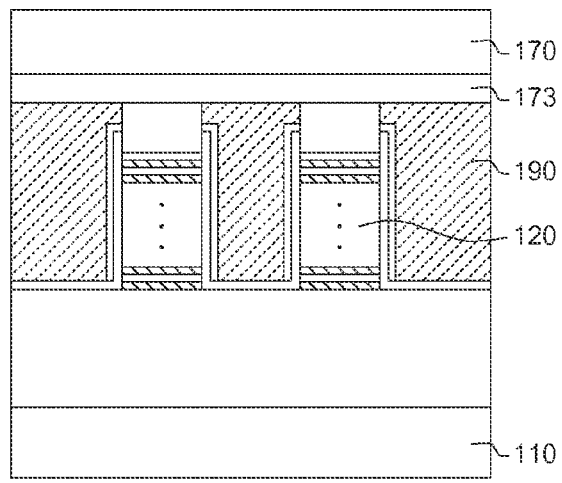

As shown in FIGS. 9A-9B (FIG. 9B shows a cross-sectional view along the section line 9B-9B' in FIG. 9A), a sacrificial layer 220 is formed on the substrate 110. In the embodiment, the sacrificial layer 220 surrounds the stacked structure 120 and covers the conductive material layer 130 on the sidewalls 120*a*, exposing an upper surface 140*a* of the conductive material layer 140. The manufacturing method of forming the sacrificial layer 220 comprises, for example: forming a sacrificial coating layer to fully cover the conductive material layer 130, the conductive material layer 140, and the substrate; and planarizing the sacrificial layer 220 to expose the upper surface 140*a* of the conductive material layer 140. In the embodiment, the sacrificial coating layer is planarized by such as a chemical mechanical polishing (CMP) process. In the embodiment, the material of the sacrificial layer 220 comprises, for example, silicon nitride (SiN).

As shown in FIGS. 10A-10E (FIGS. 10B-10E show cross-sectional views along the section lines 10B-10B' to 10E-10E' in FIG. 10A), patterning the sacrificial layer 220 to form a plurality of sacrificial strips 220*a*, and the sacrificial strips 220*a* are extended in a direction D4 perpendicular to the direction D2 which the stacked structure 120 is extended in. In the embodiment, the manufacturing method of forming the sacrificial strips 220*a* comprises, for example: forming a plurality of photoresist strips PR1 on the sacrificial layer 220 and etching the sacrificial layer 220 according to the pattern of the photoresist strips PR1 to form the sacrificial strips 220*a*. In the embodiment, the photoresist strips PR1 are arranged by such as a self-aligned double patterning (SADP) process. In the embodiment, where the sacrificial strips 220*a* are located are the predetermined positions for the conductive damascene structures to be formed in the following steps.

As shown in FIGS. 11A-11E (FIGS. 11B-11E show cross-sectional views along the section lines 11B-11B' to 11E-11E' in FIG. 11A), a region of the conductive material layer 140 exposed from the photoresist strips PR1 is etched to form a plurality of first conductive blocks 141 and a second conductive block 143 on the stacked structure 120. In the embodiment, a region of the conductive material layer 130 exposed from the photoresist strips PR1 can also be etched to form a plurality of first conductive layers 131 and a second conductive layer 133 on the sidewalls 120*a* of the stacked structure 120. In the embodiment, each of the first conductive blocks 141 is spaced apart from the others, each of the first conductive layers 131 is spaced apart form the others, and each of the second conductive layers 133 is spaced apart form the others. In the embodiment, each of the first conductive blocks 141 is adjacent to a corresponding first conductive layer 131 and a corresponding second conductive layer 133, and the first conductive layer 131 and the second conductive layer 133 are adjacent to a corresponding sacrificial layer 220*a*. In the embodiment, the first conductive block 141 is electrically connected to the first conductive layer 131 and the second conductive layer 133.

As shown in FIGS. 11A-11E, as the conductive material layer 130 and the conductive material layer 140 exposed from the photoresist strips PR1 are removed, a second conductive block 143 can be also formed on the stacked structure 120, and a third conductive layer 135 and a fourth conductive layer 137 (not shown) can also be formed on the two sidewalls 120*a* of the stacked structure 120. In the embodiment, the first conductive blocks 141 and the second conductive block 143 are spaced apart, the first conductive layers 131 and the third conductive layer 135 are spaced apart, and the second conductive layers 133 and the fourth conductive layer 137 are spaced apart. In the embodiment, the third conductive layer 135 and the fourth conductive layer 137 are adjacent to a corresponding sacrificial strip 220*a*. In the embodiment, the second conductive block 143 is electrically connected to the third conductive layer 135 and the fourth conductive layer 137.

Next, as shown in FIGS. 12A-12E (FIGS. 12B-12E show cross-sectional views along the section lines 12B-12B' to 12E-12E' in FIG. 12A), the photoresist strips PR1 are removed.

Next, as shown in FIGS. 13A-13E (FIGS. 13B-13E show cross-sectional views along the section lines 13B-13B' to 13E-13E' in FIG. 13A), an insulating structure 160 can also be formed between the sacrificial strips 220a (between the conductive damascene structures formed in the following steps). In the embodiment, the insulating structure 160 is also formed between the stacked structures 120. In the embodiment, the manufacturing method of forming the insulating structure 160 comprises, for example: forming an insulating material layer on the stacked structure 120, the first conductive blocks 141, the second conductive block 143, and the sacrificial strips 220a; and planarizing the insulating material layer to expose the first conductive blocks 141, the second conductive block 143, and the sacrificial layer 220a. In the embodiment, the insulating material layer is planarized by such as a CMP process.

Next, as shown in FIGS. 14A-14E (FIGS. 14B-14E show cross-sectional views along the section lines 14B-14B' to 14E-14E' in FIG. 14A), a cap layer 230 can also be formed on the second conductive block 143, the third conductive layer 135, the fourth conductive layer 137, and adjacent to which the sacrificial strip 220a. In the embodiment, the manufacturing method of forming the cap layer 230 comprises, for example: forming a cap material layer covering the first conductive blocks 141, the second conductive block 143, the first conductive layers 131, the second conductive layers 133, the third conductive layer 135, the fourth conductive layer 137, and the sacrificial strips 220a; and removing part of the cap material layer not covering the second conductive block 143, the third conductive layer 135, the fourth conductive layer 137, and adjacent to which the sacrificial strip 220a. In the embodiment, the material of the cap layer 230 comprises such as oxides.

Next, as shown in FIGS. 15A-16E, a plurality of conductive damascene structures 150 are formed on two sides of the stacked structure 120. Each of the first conductive blocks 141 is electrically connected to each of the conductive damascene structures 150 via each of the first conductive strips 131 and each of the second conductive strips 133. The manufacturing method of forming the conductive damascene structures 150 on the two sides of the stacked structure comprises such as the following steps.

As shown in FIGS. 15A-15E (FIGS. 15B-15E show cross-sectional views along the section lines 15B-15B' to 15E-15E' in FIG. 15A), a plurality of trenches T are formed on the two sides of the stacked structure 120. In the embodiment, the trenches T are extended in a direction D5 perpendicular to the direction D2 which the stacked structure 120 is extended in. In the embodiment, the manufacturing method of forming the trenches T comprises, for example: removing the sacrificial strips 220 exposed from the cap layer 230. In the embodiment, the sacrificial strips 220a are removed by such as an etching process, and the sacrificial layer covered by the cap layer 230 is not removed.

As shown in FIGS. 16A-16E (FIGS. 16B-16E show cross-sectional views along the section lines 16B-16B' to 16E-16E' in FIG. 16A), a conductive material is filled in the trenches T to form the conductive damascene structure 150. In the embodiment, the conductive damascene structures 150 are formed in trenches T which are separated from one another. Therefore, a good insulation between the conductive damascene structures 150 is achieved. That is to say, each of conductive damascene structures 150 is formed independently in each of the trenches T, which are separated from one another, by a damascene process, such that the conductive damascene structures 150 are perfectly separated from one another. There would be no residual conductive materials between the conductive damascene structures 150, thus, a good insulation between the conductive damascene structures 150 is achieved, and the reliability of the device to be manufactured in the following process an be improved.

Next, as shown in FIGS. 17A-17E (FIGS. 17B-17E show cross-sectional views along the section lines 17B-17B' to 17E-17E' in FIG. 17A), the cap layer 230 is removed.

Next, as shown in FIGS. 18A-19E, an insulating damascene structure 190 can also be formed on two sides of the second conductive block 143. The insulating damascene structure 190 is located adjacent to the second conductive block 143. The manufacturing method of forming the insulating damascene structure 190 on the two sides of the second conductive block 143 comprises such as the following steps.

As shown in FIGS. 18A-18E (FIGS. 18B-18E show cross-sectional views along the section lines 18B-18B' to 18E-18E' in FIG. 18A), a trench T' is formed on the two sides of the second conductive block 143. In the embodiment, the trench T' is extended in a direction D6 perpendicular to the direction D2 which the stacked structure is extended in. In the embodiment, the manufacturing method of forming the trench T' comprises, for example: removing the sacrificial strip 220a previously covered by the cap layer 230. That is, the sacrificial strip 220a located adjacent to the second conductive block 143, the third conductive layer 135, and the fourth conductive layer 137 is removed. In the embodiment, the sacrificial strip 220a is removed by such as an etching process.

As shown in FIGS. 19A-19F (FIGS. 19B-19F show cross-sectional views along the section lines 19B-19B' to 19F-19F' in FIG. 19A), an insulating material is filled in the trench T' to form the insulating damascene structure 190.

Next, as shown in FIGS. 20A-20F (FIGS. 20B-20F show cross-sectional views along the section lines 20B-20B' to 20E-20F' in FIG. 20A), a dielectric layer 170 can also be formed on the stacked structure 120. In the embodiment, the dielectric layer 170 can also be formed on the conductive damascene structures 150 and the insulating damascene structure 190. In the embodiment, an etching stop layer 173 can also be formed between the dielectric layer 170 and the stacked structure 120.

Figure 21:
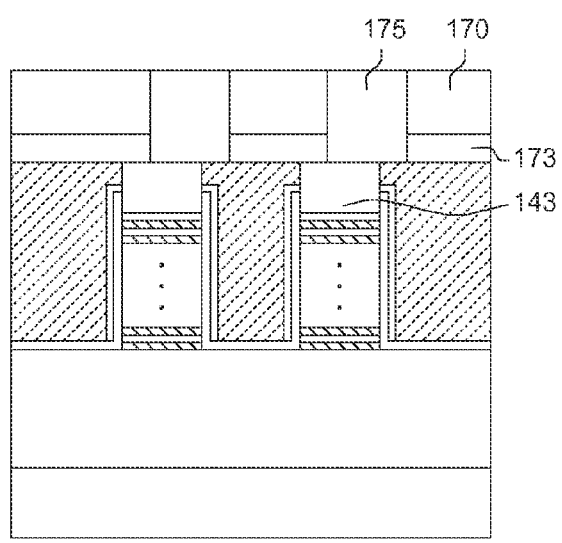

Next, as shown in FIG. 21, a contact hole 175 can also be formed in the dielectric layer 170. In the embodiment, the contact hole 175 is electrically connected to the second conductive block 143.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a stacked structure formed on a substrate, wherein the stacked structure comprises a plurality of conductive strips and a plurality of insulating strips, and the conductive strips and the insulating strips are interlaced;
   a plurality of first conductive block formed on the stacked structure;
   a plurality of first conductive layers and a plurality of second conductive layers formed on two sidewalls of the stacked structure, respectively;
   a plurality of conductive damascene structures formed on two sides of the stacked structure, wherein each of the first conductive blocks is electrically connected to each of the conductive damascene structures via each of the first conductive strips and each of the second conductive strips.

2. The semiconductor structure according to claim 1, further comprising an insulating structure formed between the conductive damascene structures.

3. The semiconductor structure according to claim 1, further comprising a dielectric layer formed on the stacked structure and the conductive damascene structures.

4. The semiconductor structure according to claim 1, wherein the conductive damascene structures are extended in a direction perpendicular to a direction which the stacked structure is extended in.

5. The semiconductor structure according to claim 1, further comprising a memory material layer formed on the two sidewalls of the stacked structure, wherein the memory material layer is formed between the first conductive layers and the stacked structure and between the second conductive layers and the stacked structure.

6. The semiconductor structure according to claim 1, further comprising:
   a second conductive block formed on the stacked structure; and
   a third conductive layer and a fourth conductive layer formed on the two sidewalls of the stacked structure, respectively, wherein the second conductive block is electrically connected to the third conductive layer and the fourth conductive layer.

7. The semiconductor structure according to claim 6, further comprising an insulating damascene structure formed on two sides of the second conductive block, and the insulating damascene structure is connected to the second conductive block.

8. The semiconductor structure according to claim 7, wherein the insulating damascene structure is extended in a direction parallel to a direction which the conductive damascene structures are extended in.

9. The semiconductor structure according to claim 6, further comprising:
   a dielectric layer formed on the stacked structure; and
   a contact hole formed in the dielectric layer and electrically connected to the second conductive block.

10. A manufacturing method of a semiconductor structure, comprising:
    forming a stacked structure on a substrate, comprising forming a plurality of conductive strips and a plurality of insulating strips, and the conductive strips and the insulating strips are interlaced;
    forming a plurality of first conductive blocks on the stacked structure;
    forming a plurality of first conductive layers and a plurality of second conductive layers on two sidewalls of the stacked structure, respectively; and
    forming a plurality of conductive damascene structures on two sides of the stacked structure, wherein each of the first conductive blocks is electrically connected to each of the conductive damascene structures via each of the first conductive strips and each of the second conductive strips.

11. The method of manufacturing the semiconductor structure according to claim 10, further comprising:
    forming an insulating structure between the conductive damascene structures.

12. The method of manufacturing the semiconductor structure according to claim 10, further comprising:
    forming a dielectric layer on the stacked structure and the conductive damascene structures.

13. The method of manufacturing the semiconductor structure according to claim 10, further comprising:
    forming a memory material layer on the two sidewalls of the stacked structure, wherein the memory material layer is formed between the first conductive layers and the stacked structure and between the second conductive layers and the stacked structure.

14. The method of manufacturing the semiconductor structure according to claim 10, further comprising:
    forming a second conductive block on the stacked structure; and
    forming a third conductive layer and a fourth conductive layer on the two sidewalls of the stacked structure, wherein the second conductive block is electrically connected to the third conductive layer and the fourth conductive layer.

15. The method of manufacturing the semiconductor structure according to claim 14, further comprising:
    forming an insulating damascene structure on two sides of the second conductive block, and the insulating damascene structure is connected to the second conductive block.

16. The method of manufacturing the semiconductor structure according to claim 15, wherein the step of forming the insulating damascene structure on the two sides of the second conductive block comprises:
    forming a trench on the two sides of the second conductive block, wherein the trench is extended in a direction perpendicular to a direction which the stacked structure is extended in; and
    filling an insulating material in the trench to form the insulating damascene structure.

17. The method of manufacturing the semiconductor structure according to claim 14, further comprising:
    forming a dielectric layer on the stacked structure; and
    forming a contact hole in the dielectric layer, wherein the contact hole is electrically connected to the second conductive block.

18. The method of manufacturing the semiconductor structure according to claim 10, wherein the step of forming the first conductive layers and the second conductive layers on the two sidewalls of the stacked structure, respectively, comprises:
    forming a conductive material layer on the stacked structure and the first conductive blocks; and
    etching the conductive material layer to expose the first conductive blocks and form the first conductive layers and the second conductive layers on the two sidewalls of the stacked structure.

19. The method of manufacturing the semiconductor structure according to claim 10, wherein the step of forming the conductive damascene structures on the two sides of the stacked structure comprises:
    forming a plurality of trenches on the two sides of the stacked structure, wherein the trenches are extended in a direction perpendicular to a direction which the stacked structure is extended in; and
    filling a conductive material in the trenches to form the conductive damascene structures.

* * * * *